United States Patent
Zhang et al.

(10) Patent No.: US 10,811,058 B2
(45) Date of Patent: Oct. 20, 2020

(54) BONDED ASSEMBLY CONTAINING MEMORY DIE BONDED TO INTEGRATED PERIPHERAL AND SYSTEM DIE AND METHODS FOR MAKING THE SAME

(71) Applicant: SANDISK TECHNOLOGIES LLC, Addison, TX (US)

(72) Inventors: Yanli Zhang, San Jose, CA (US); Zhixin Cui, Nagoya (JP); Akio Nishida, Yokkaichi (JP); Johann Alsmeier, San Jose, CA (US); Yan Li, Milpitas, CA (US); Steven Sprouse, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 73 days.

(21) Appl. No.: 16/269,301

(22) Filed: Feb. 6, 2019

(65) Prior Publication Data
US 2020/0251149 A1 Aug. 6, 2020

(51) Int. Cl.
| | |
|---|---|
| *G11C 5/06* | (2006.01) |
| *G06F 11/08* | (2006.01) |
| *G11C 8/14* | (2006.01) |
| *H01L 23/538* | (2006.01) |

(Continued)

(52) U.S. Cl.
CPC ............... *G11C 5/06* (2013.01); *G06F 11/08* (2013.01); *G11C 8/14* (2013.01);
(Continued)

(58) Field of Classification Search
CPC ........ G11C 2213/71; G11C 16/26; G11C 7/12
See application file for complete search history.

(56) References Cited

U.S. PATENT DOCUMENTS

| 5,915,167 A | 6/1999 | Leedy |
| 10,461,076 B1 * | 10/2019 | Brewer ................. H01L 23/481 |

(Continued)

FOREIGN PATENT DOCUMENTS

CN 109075170 A 12/2018

OTHER PUBLICATIONS

Notification of Transmittal of the International Search Report and Written Opinion of the International Search Authority for International Patent Application No. PCT/US2019/062922, dated Mar. 16, 2020, 12 pages.

(Continued)

*Primary Examiner* — Tuan T Nguyen
(74) *Attorney, Agent, or Firm* — The Marbury Law Group PLLC

(57) ABSTRACT

A bonded assembly includes a memory die bonded to a support die. The memory die contains at least one three-dimensional array of memory elements, memory-die dielectric material layers, and memory-die bonding pads. The support die contains at least one peripheral circuitry including complementary metal-oxide-semiconductor (CMOS) devices and configured to generate control signals for, and receive sense signals from, the at least one three-dimensional array of memory elements and a functional module and configured to provide a functionality that is independent of operation of the at least one three-dimensional array of memory elements. The functional module may include an error correction code (ECC) module, a memory module configured to interface with an external processor module located outside of the memory die, a microprocessor unit module, a wireless communication module, and/or a system level controller module.

20 Claims, 38 Drawing Sheets

(51) Int. Cl.
*H01L 27/105* (2006.01)
*H01L 23/498* (2006.01)
*H01L 25/065* (2006.01)

(52) U.S. Cl.
CPC .... *H01L 23/49822* (2013.01); *H01L 23/5389* (2013.01); *H01L 25/0657* (2013.01); *H01L 27/1052* (2013.01)

(56) References Cited

U.S. PATENT DOCUMENTS

| | | | |
|---|---|---|---|
| 10,665,581 B1* | 5/2020 | Zhou | G11C 16/30 |
| 2009/0090960 A1 | 4/2009 | Izumi et al. | |
| 2010/0091537 A1* | 4/2010 | Best | G11C 5/02 365/51 |
| 2013/0294184 A1 | 11/2013 | Yang et al. | |
| 2014/0036566 A1* | 2/2014 | Zhang | G11C 8/14 365/63 |
| 2014/0063990 A1 | 3/2014 | Ku et al. | |
| 2016/0055922 A1 | 2/2016 | Yang et al. | |
| 2016/0181228 A1 | 6/2016 | Higuchi et al. | |
| 2017/0294377 A1 | 10/2017 | Dunga et al. | |
| 2017/0365780 A1* | 12/2017 | Narayanan | H01L 45/04 |
| 2018/0005709 A1 | 1/2018 | Yang et al. | |
| 2018/0374864 A1 | 12/2018 | Fukuzumi et al. | |
| 2019/0006318 A1 | 1/2019 | Waidhas et al. | |
| 2019/0043836 A1 | 2/2019 | Fastow et al. | |
| 2019/0067314 A1* | 2/2019 | Lu | H01L 27/11582 |
| 2019/0341399 A1* | 11/2019 | Tao | H01L 21/76877 |
| 2020/0135719 A1* | 4/2020 | Brewer | H01L 21/76898 |
| 2020/0176420 A1* | 6/2020 | Or-Bach | H01L 25/18 |

OTHER PUBLICATIONS

Endoh et al., titled "Novel Ultra High Density Memory With A Stacked-Surrounding Gate Transistor (S-SGT) Structured Cell", IEDM Proc. (2001) 33-36.

U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/960,267, filed Apr. 23, 2018, SanDisk Technologies LLC.
U.S. Appl. No. 15/979,885, filed May 15, 2018, SanDisk Technologies LLC.
U.S. Appl. No. 16/231,752, filed Dec. 24, 2018, SanDisk Technologies LLC.
U.S. Appl. No. 16/241,171, filed Jan. 7, 2019, SanDisk Technologies LLC.
U.S. Appl. No. 16/241,221, filed Jan. 7, 2019, SanDisk Technologies LLC.
U.S. Appl. No. 16/242,216, filed Jan. 8, 2019, SanDisk Technologies LLC.
U.S. Appl. No. 16/243,469, filed Jan. 9, 2019, SanDisk Technologies LLC.
U.S. Appl. No. 16/248,923, filed Jan. 16, 2019, SanDisk Technologies LLC.
U.S. Appl. No. 16/251,782, filed Jan. 18, 2019, SanDisk Technologies LLC.
U.S. Appl. No. 16/251,954, filed Jan. 18, 2019, SanDisk Technologies LLC.
U.S. Appl. No. 16/255,413, filed Jan. 23, 2019, SanDisk Technologies LLC.
U.S. Appl. No. 16/261,869, filed Jan. 30, 2019, SanDisk Technologies LLC.
U.S. Appl. No. 16/263,058, filed Jan. 31, 2019, SanDisk Technologies LLC.
U.S. Appl. No. 16/263,086, filed Jan. 31, 2019, SanDisk Technologies LLC.

* cited by examiner

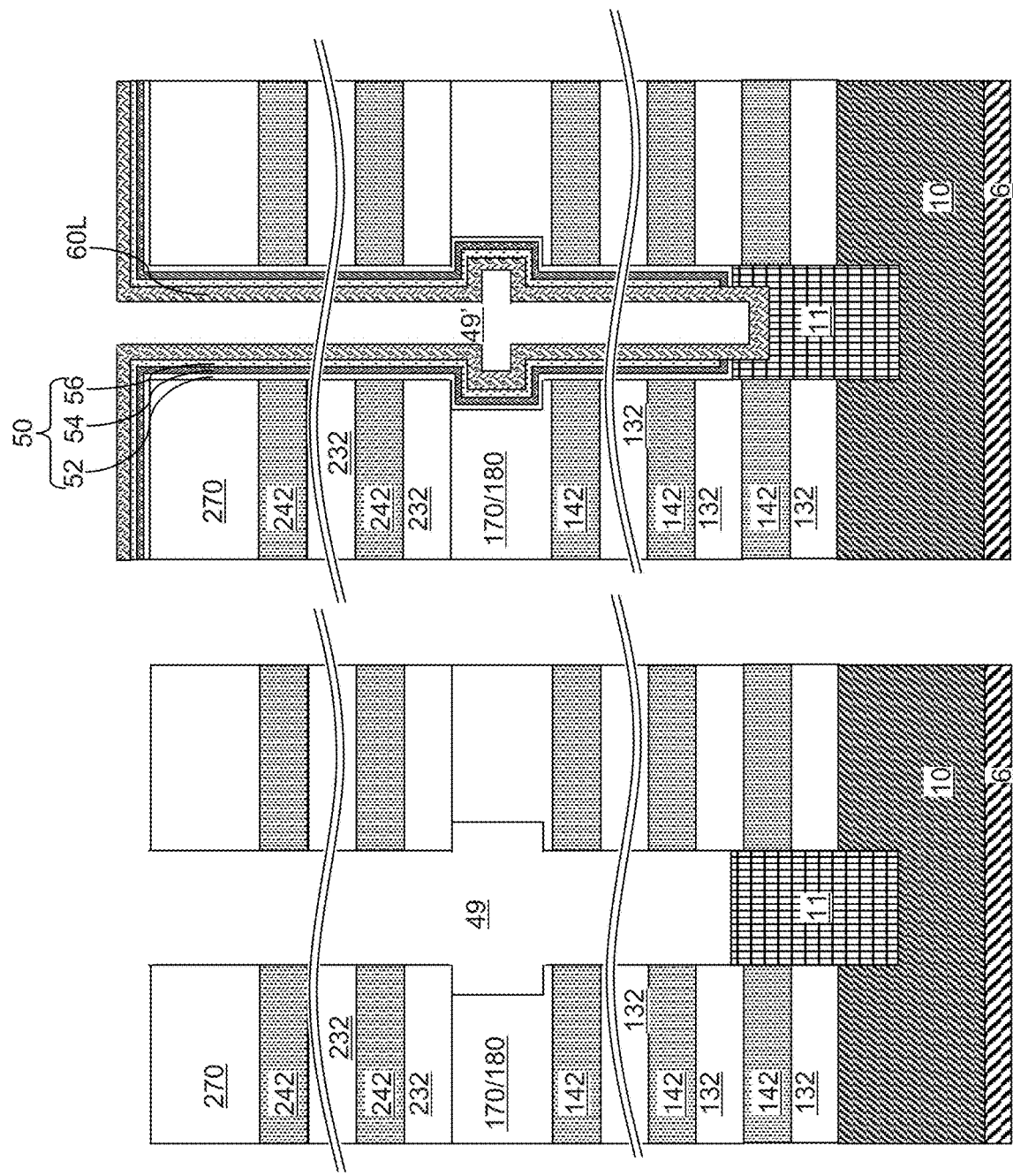

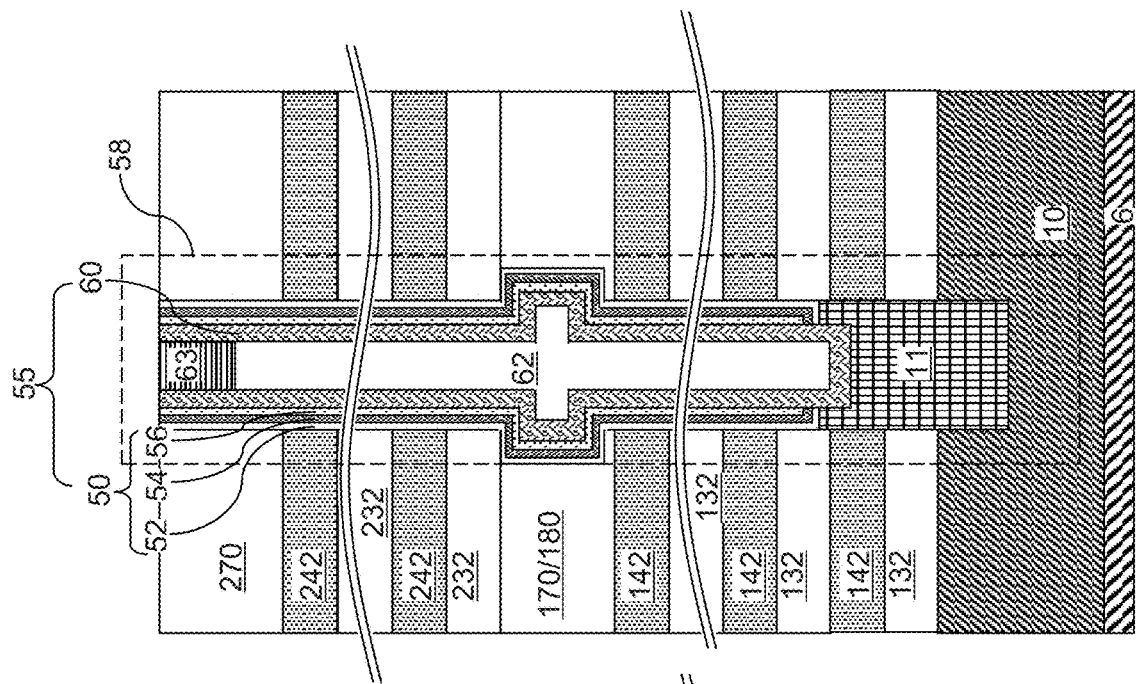
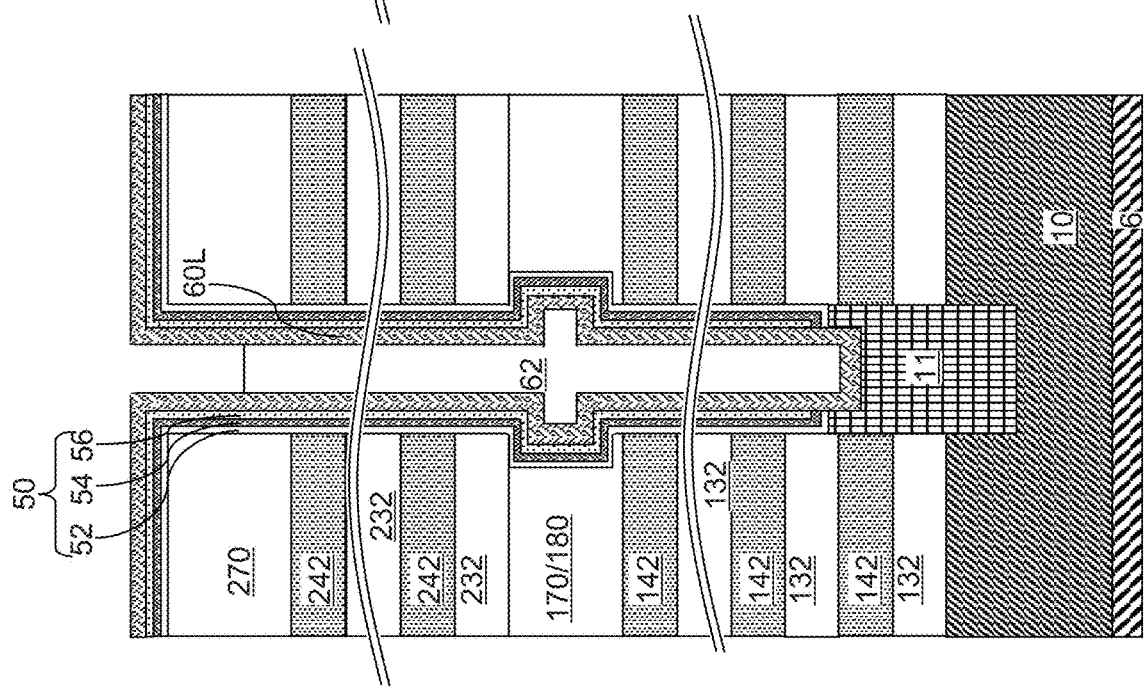

BONDED ASSEMBLY CONTAINING MEMORY DIE BONDED TO INTEGRATED PERIPHERAL AND SYSTEM DIE AND METHODS FOR MAKING THE SAME

FIELD

The present disclosure relates generally to the field of semiconductor devices, and particular to integrated peripheral and system die bonded to a memory die and method for making the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly is provided, which comprises: a first memory die comprising at least one first three-dimensional array of memory elements, first memory-die metal interconnect structures formed within first memory-die dielectric material layers, and first memory-die bonding pads that are located on, or formed within, the first memory-die dielectric material layers and electrically connected to a respective node of the at least one first three-dimensional array of memory elements; and a first support die comprising at least one first peripheral circuitry including complementary metal-oxide-semiconductor (CMOS) devices and configured to generate control signals for, and receive sense signals from, the at least one first three-dimensional array of memory elements and a first functional module configured to provide a functionality that is independent of operation of the at least one first three-dimensional array of memory elements, wherein the first support die comprises first support-die bonding pads that are located on, or formed within, first support-die dielectric material layers, electrically connected to a respective node of the at least one first peripheral circuitry, and bonded to the first memory-die bonding pads.

According to another embodiment of the present disclosure, a method of forming a bonded assembly is provided, which comprises: providing a first memory die comprising at least one first three-dimensional array of memory elements, first memory-die metal interconnect structures formed within first memory-die dielectric material layers, and first memory-die bonding pads that are located on, or formed within, the first memory-die dielectric material layers and electrically connected to a respective node of the at least one first three-dimensional array of memory elements; providing a first support die comprising at least one first peripheral circuitry including complementary metal-oxide-semiconductor (CMOS) devices and configured to generate control signals for, and receive sense signals from, the at least one first three-dimensional array of memory elements and a first functional module configured to provide a functionality that is independent of operation of the at least one first three-dimensional array of memory elements, wherein the first support die comprises first support-die bonding pads that are located on, or formed within, first support-die dielectric material layers, electrically connected to a respective node of the at least one first peripheral circuitry; and bonding the first support-die bonding pads to the first memory-die bonding pads.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

DETAILED DESCRIPTION

Figure 1:
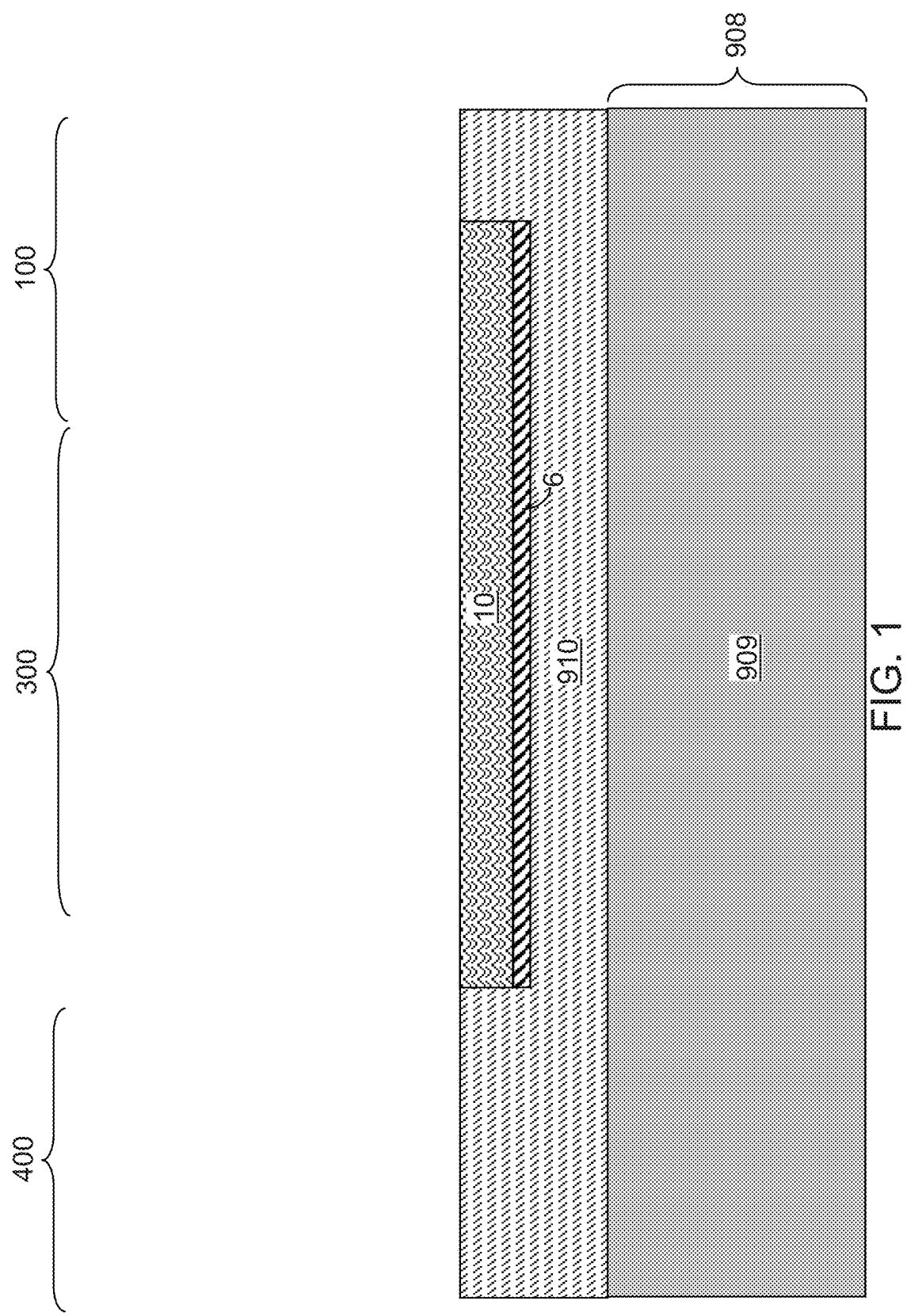
FIG. 1 is a vertical cross-sectional view of an exemplary structure after formation of a source-side dielectric material layer and a doped semiconductor layer on a semiconductor substrate according to an embodiment of the present disclosure.

As discussed above, embodiments of the present disclosure are directed to integrated memory and system chips including a three-dimensional memory array and functional device elements and method for making the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure including an in-process memory die is illustrated. As used herein, a memory die is a semiconductor die including an array of memory elements. As such, an in-process memory die is a structure that is subsequently modified to form a memory die.

The exemplary structure includes a carrier substrate 908, which includes a carrier substrate layer 909. The carrier substrate 908 may comprise a commercially available semiconductor wafer such as a single crystalline silicon wafer. A source-side dielectric material layer 910 is formed over the carrier substrate layer 909. The source-side dielectric material layer 910 includes a dielectric material such as silicon oxide. The maximum thickness of the source-side dielectric material layer 910 may be in a range from 200 nm to 3,000 nm, although lesser and greater thicknesses may also be used.

An optional metallic plate layer 6 and a source semiconductor layer 10 may be may be formed in the source-side dielectric material layer 910. The optional metallic plate layer 6, if present, provides a high conductivity conduction path for electrical current that flows into, along, and/or out of, the source semiconductor layer 10. The optional metallic plate layer 6 includes a conductive material such as a metal or a heavily doped semiconductor material. The optional metallic plate layer 6, for example, may include a tungsten layer having a thickness in a range from 3 nm to 100 nm, although lesser and greater thicknesses may also be used. A metal nitride layer (not shown) may be provided as a diffusion barrier layer on top of the metallic plate layer 6. The metallic plate layer 6 may function as a component of a source line in a completed die. The thickness of the metallic plate layer 6 may be in a range from 20 nm to 200 nm, although lesser and greater thicknesses may also be used.

The source semiconductor layer 10 is a doped semiconductor layer having a doping of the opposite conductivity type of the conductivity type of vertical semiconductor channels to be subsequently formed. For example, if vertical semiconductor channels to be subsequently formed have a doping of a first conductivity type, the source semiconductor layer 10 may have a doping of a second conductivity type that is the opposite of the first conductivity type. For example, if the first conductivity type is p-type, the second conductivity type is n-type, and vice versa. The atomic concentration of second conductivity type dopants in the source semiconductor layer 10 may be in a range from $5.0 \times 10^{19}/cm^3$ to $2.0 \times 10^{21}/cm^3$, although lesser and greater atomic concentrations may also be used. The thickness of the source semiconductor layer 10 may be in a range from 100 nm to 600 nm, although lesser and greater thicknesses may also be used.

The source semiconductor layer 10 and the metallic plate layer 6 may be patterned such that the source semiconductor layer 10 and the metallic plate layer 6 extend over at least a portion of a memory array region 100 in which memory stack structures are to be subsequently formed and over a staircase region 300 in which stepped surfaces of electrically conductive layers embodying word lines are to be subsequently formed. A via interconnection region 400 may be provided around the memory array region 100 and the staircase region 300. In one embodiment, the top surface of the source semiconductor layer 10 may be coplanar with the top surface of the source-side dielectric material layer 910.

Figure 2:
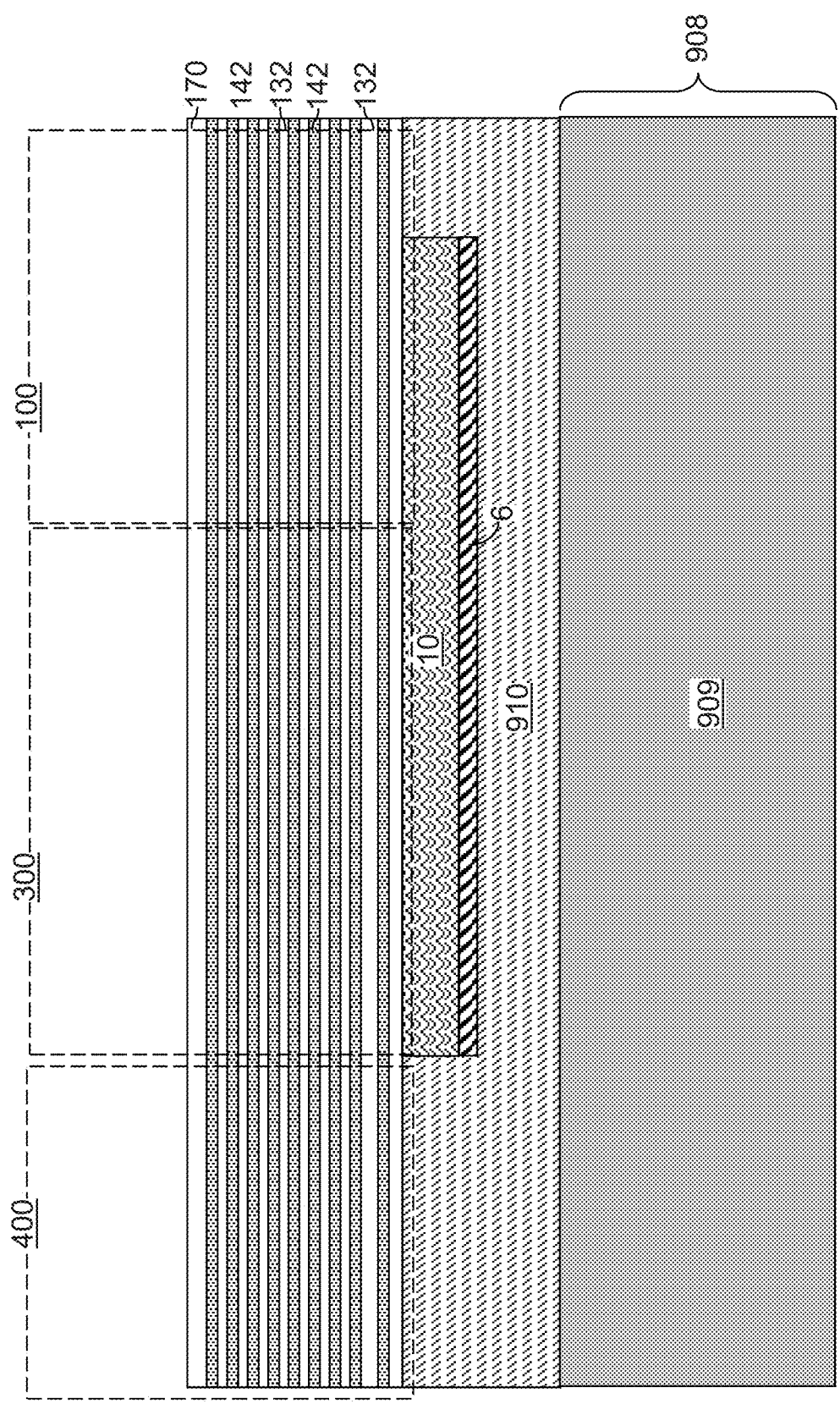
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers may be subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 may be formed over the source semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first alternating stack (132, 142). The first insulating cap layer 170 may include a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
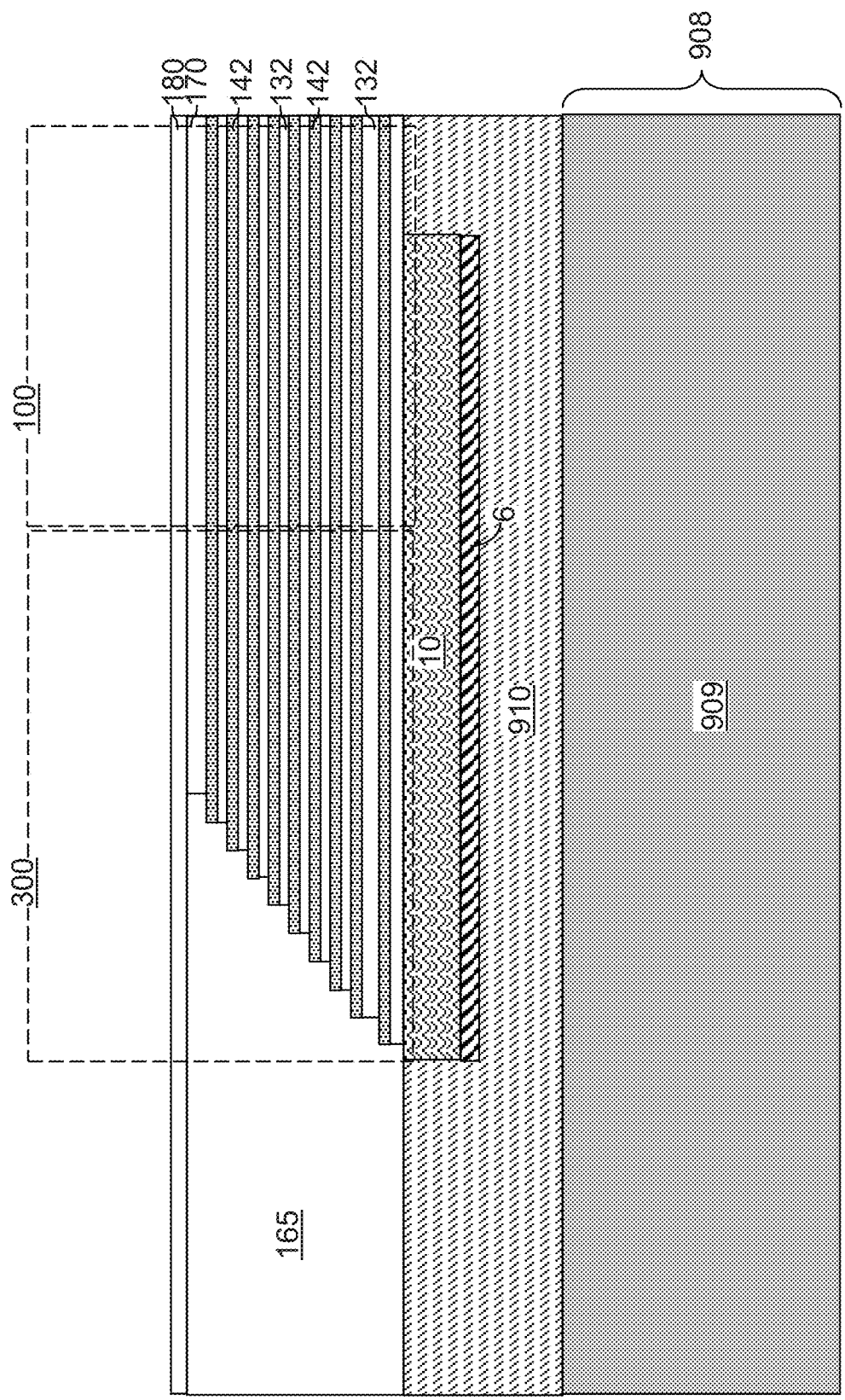
FIG. 3 is a vertical cross-sectional view of the exemplary structure after patterning a first-tier staircase region, a first stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 300. The staircase region 300 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
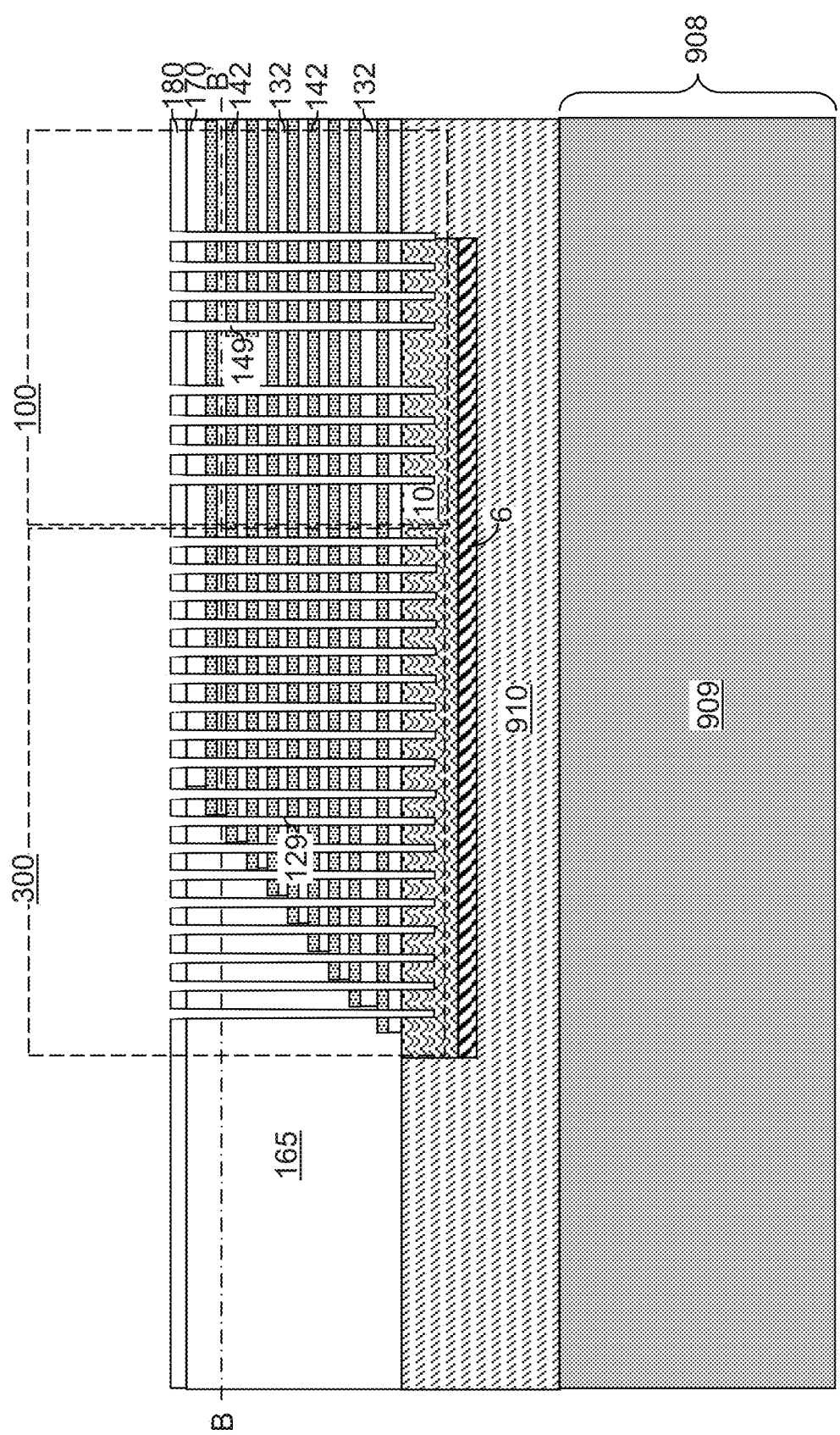
FIG. 4A is a vertical cross-sectional view of the exemplary structure after formation of first-tier memory openings and first-tier support openings according to an embodiment of the present disclosure.
Figure 4B:
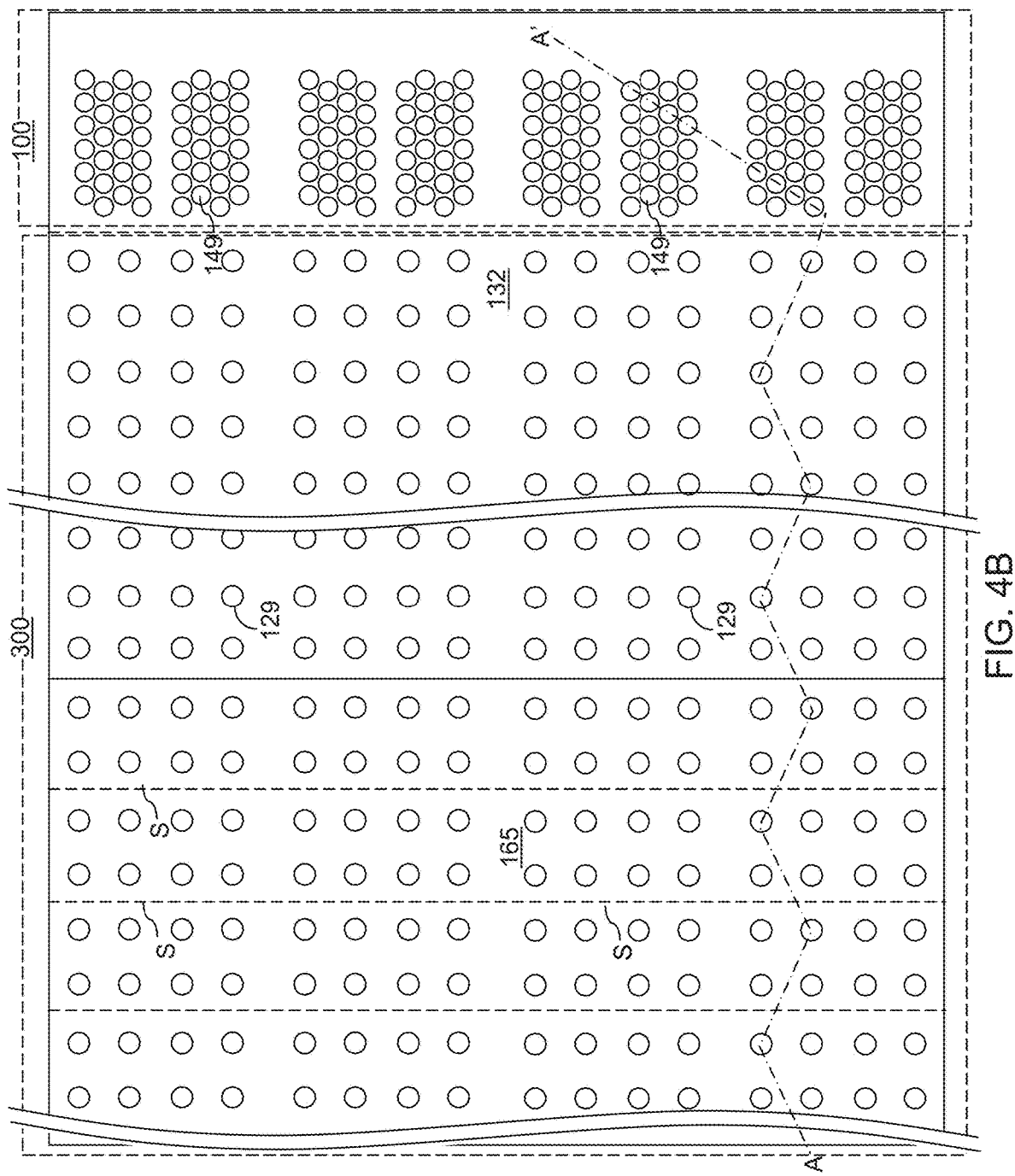
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the source semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the source semiconductor layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 may be openings that are formed in the memory array region 100 through each layer within the first alternating stack (132, 142) and may be subsequently used to form memory stack structures therein. The first-tier memory openings 149 may be formed in clusters of first-tier memory openings 149 that may be laterally spaced apart along the second horizontal direction hd2. Each cluster of first-tier memory openings 149 may be formed as a two-dimensional array of first-tier memory openings 149.

The first-tier support openings 129 are openings that are formed in the staircase region 300. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) may be etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered. In one embodiment, the terminal portion of the anisotropic etch process may include an overetch step that etches into an upper portion of the source semiconductor layer 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
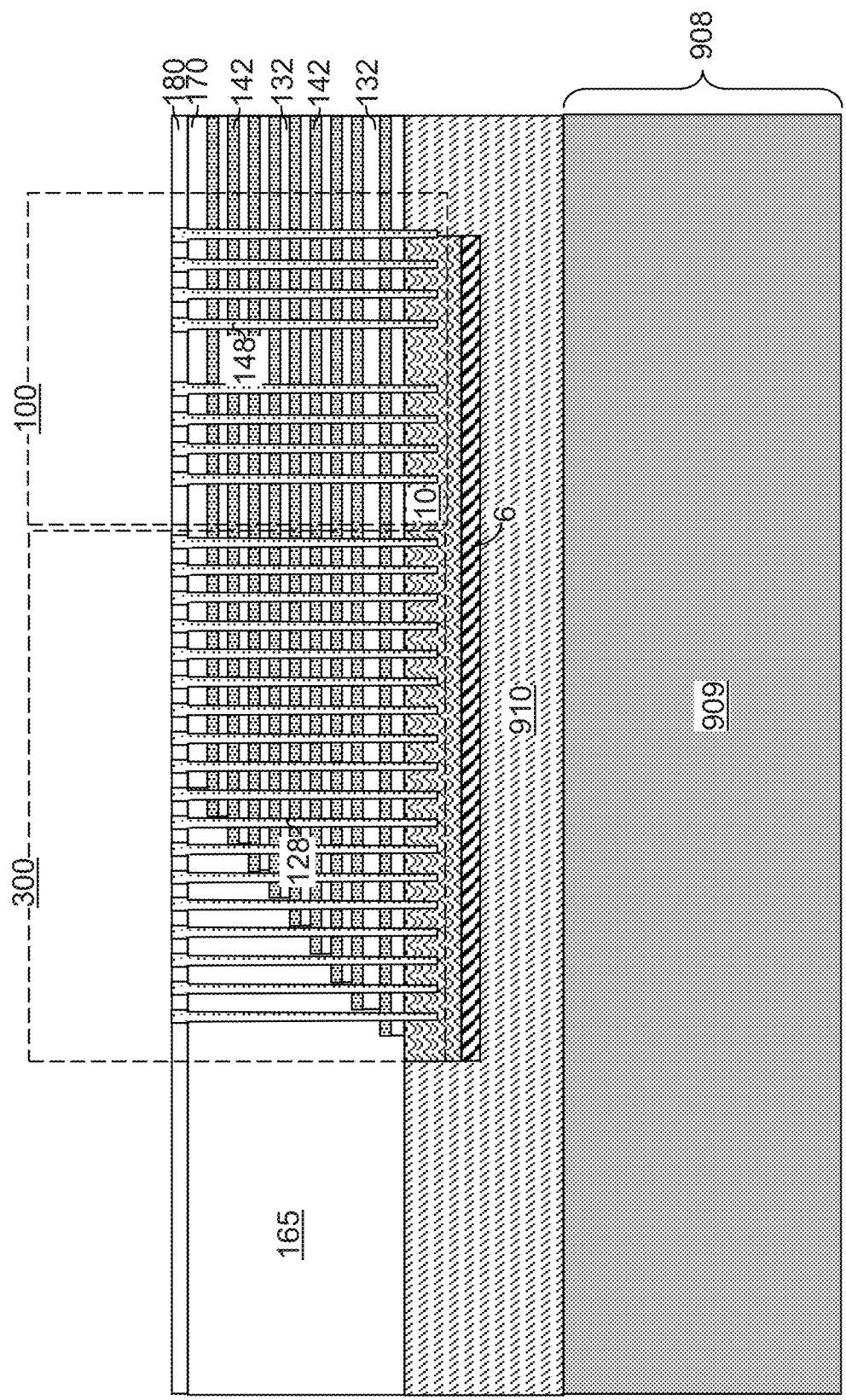
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) may be concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
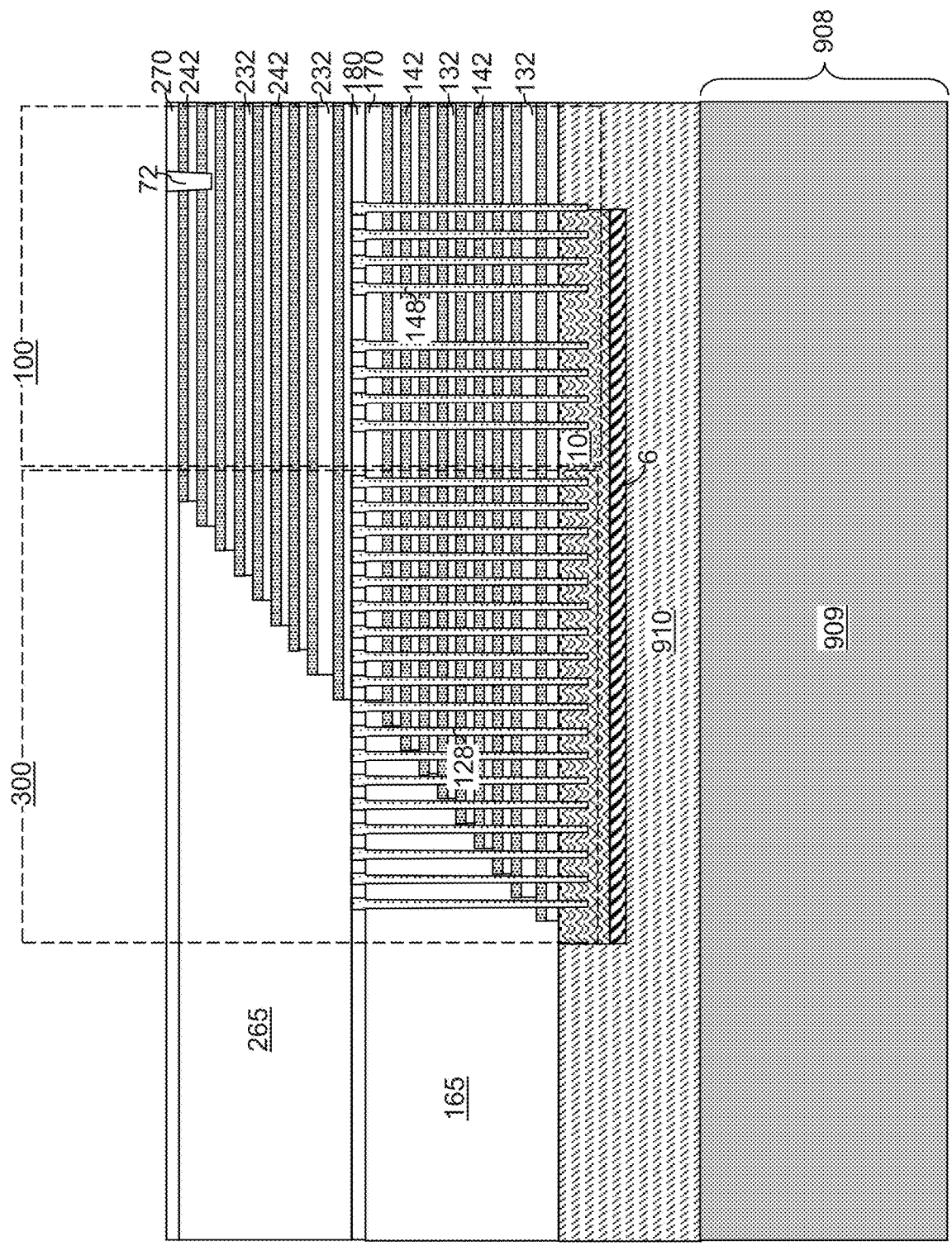
FIG. 6 is a vertical cross-sectional view of the exemplary structure after formation of a second-tier alternating stack of second insulating layers and second spacer material layers, second stepped surfaces, and a second stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 300 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 300.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the source semiconductor layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
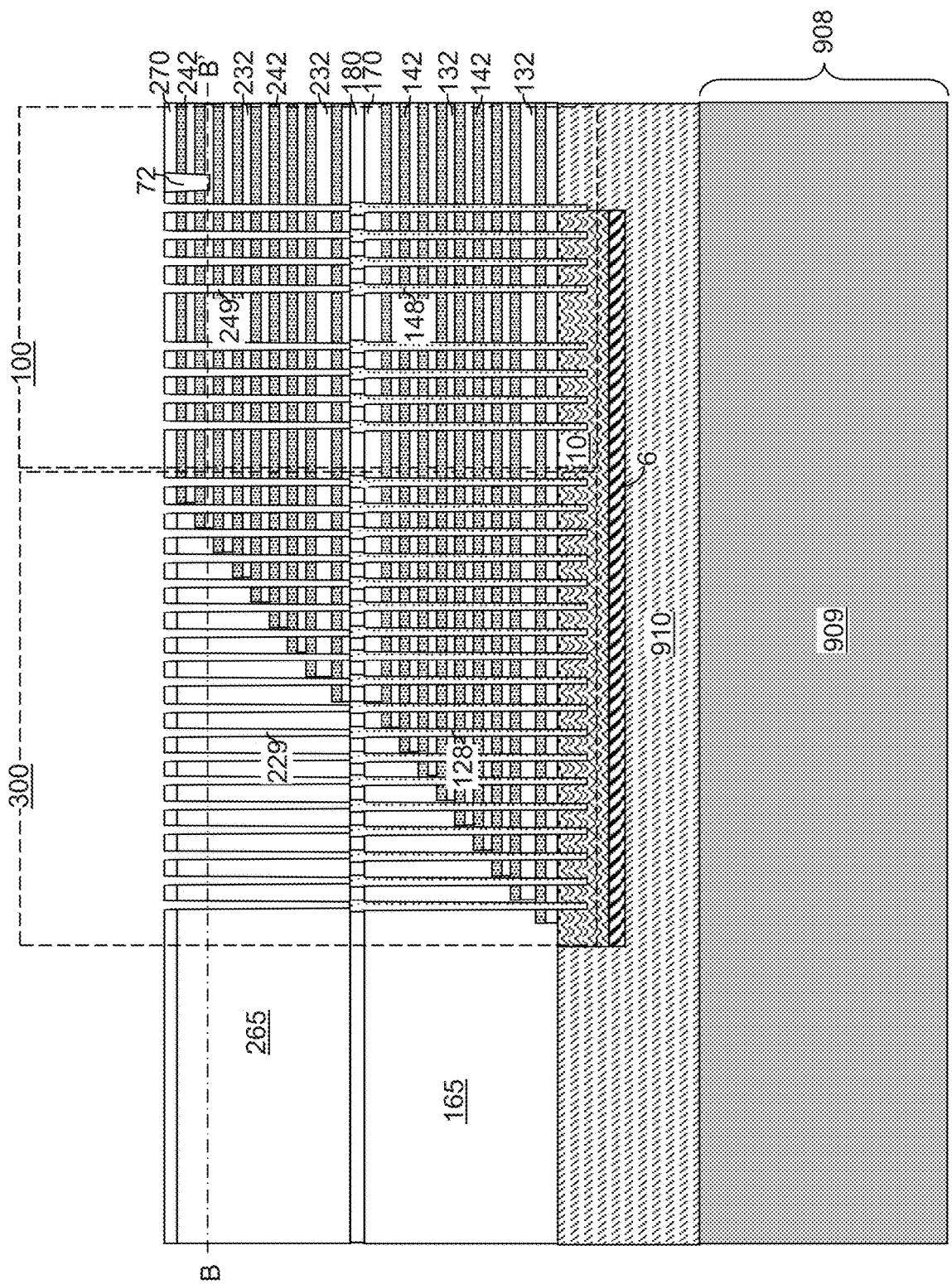
FIG. 7A is a vertical cross-sectional view of the exemplary structure after formation of second-tier memory openings and second-tier support openings according to an embodiment of the present disclosure.
Figure 7B:
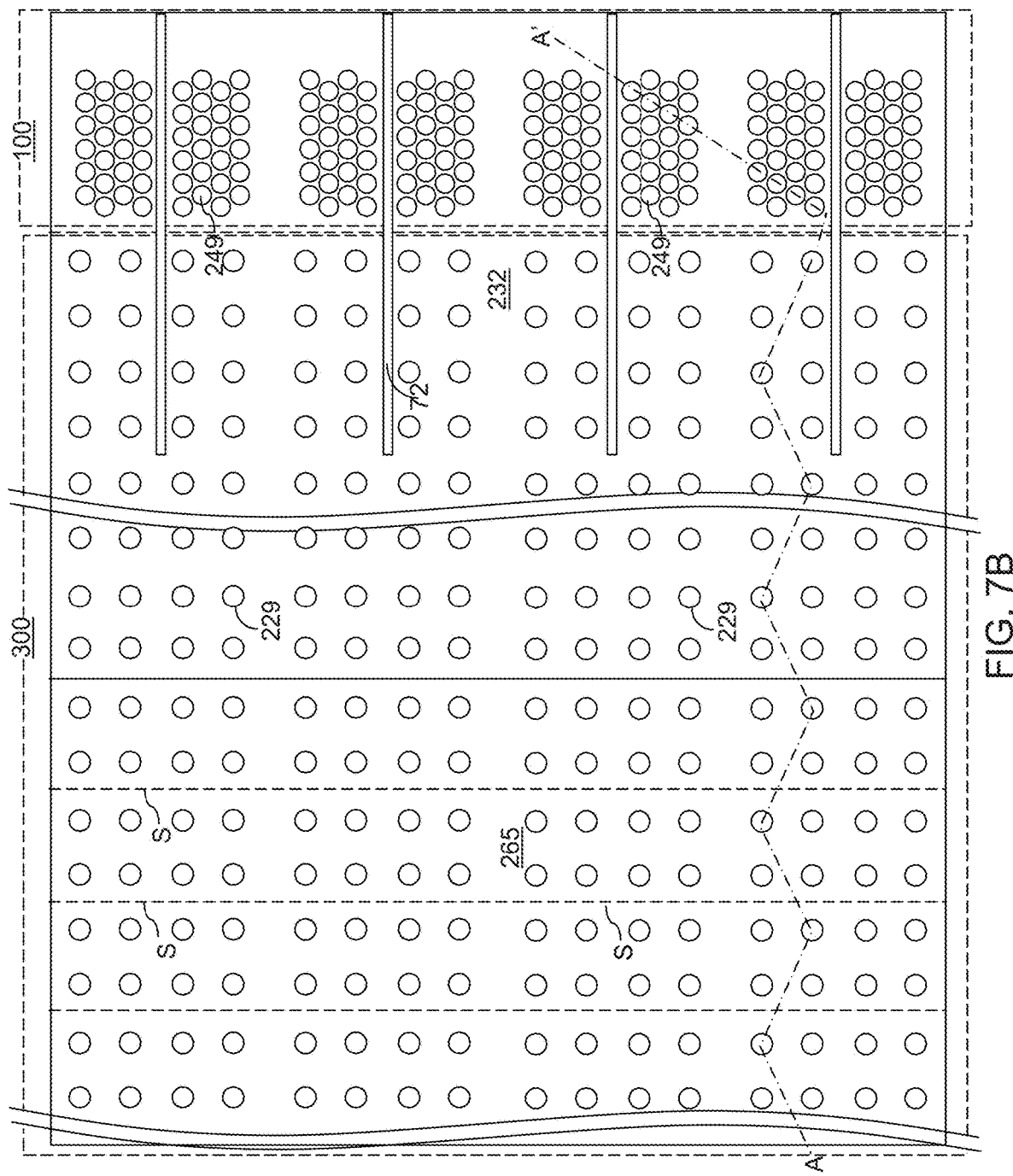
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
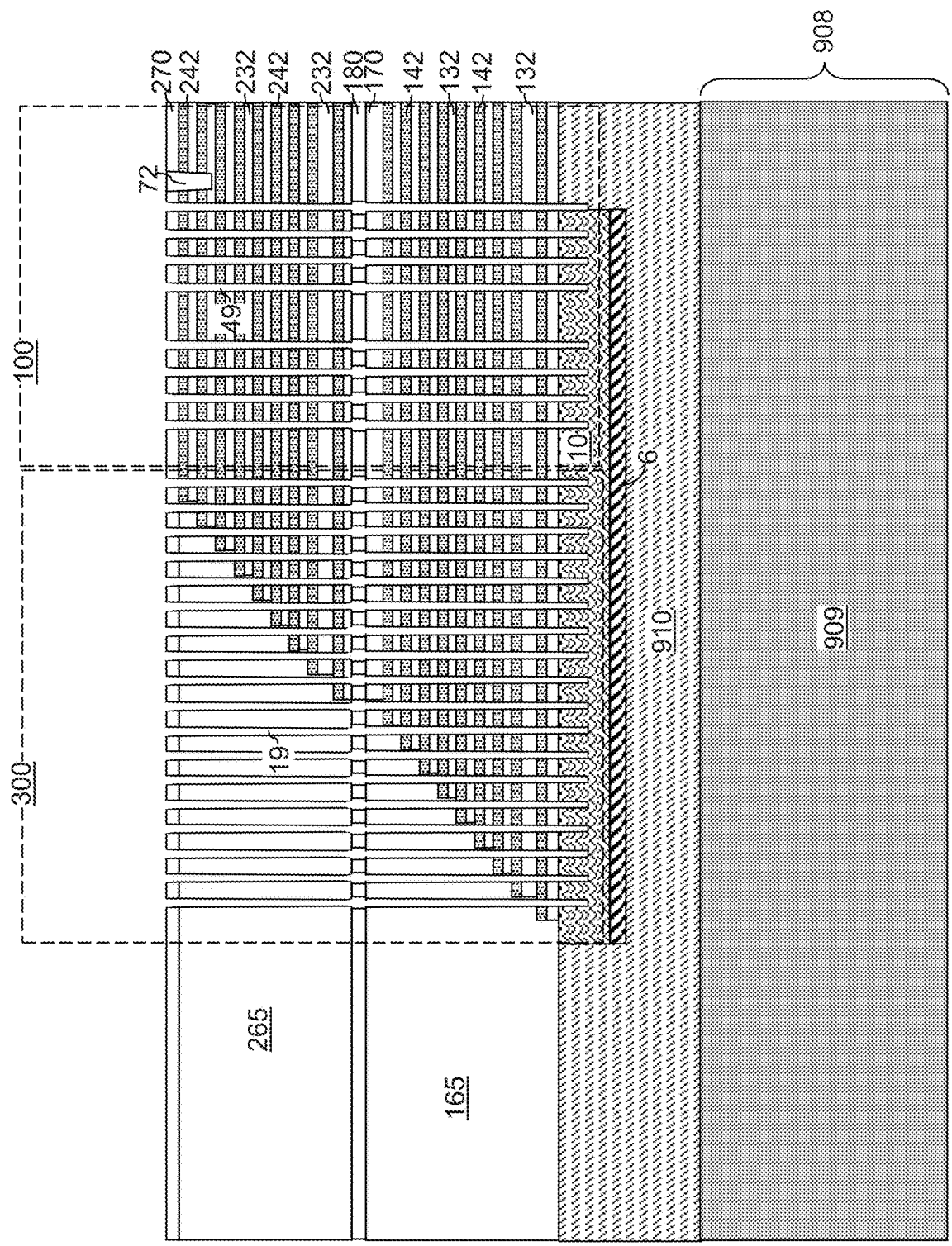
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the source semiconductor layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from 1.0×1014/cm3 to 1.0×1018/cm3, although lesser and greater dopant atomic concentrations may also be used. A p-n junction may be formed at each interface between the source semiconductor layer 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The source semiconductor layer 10, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
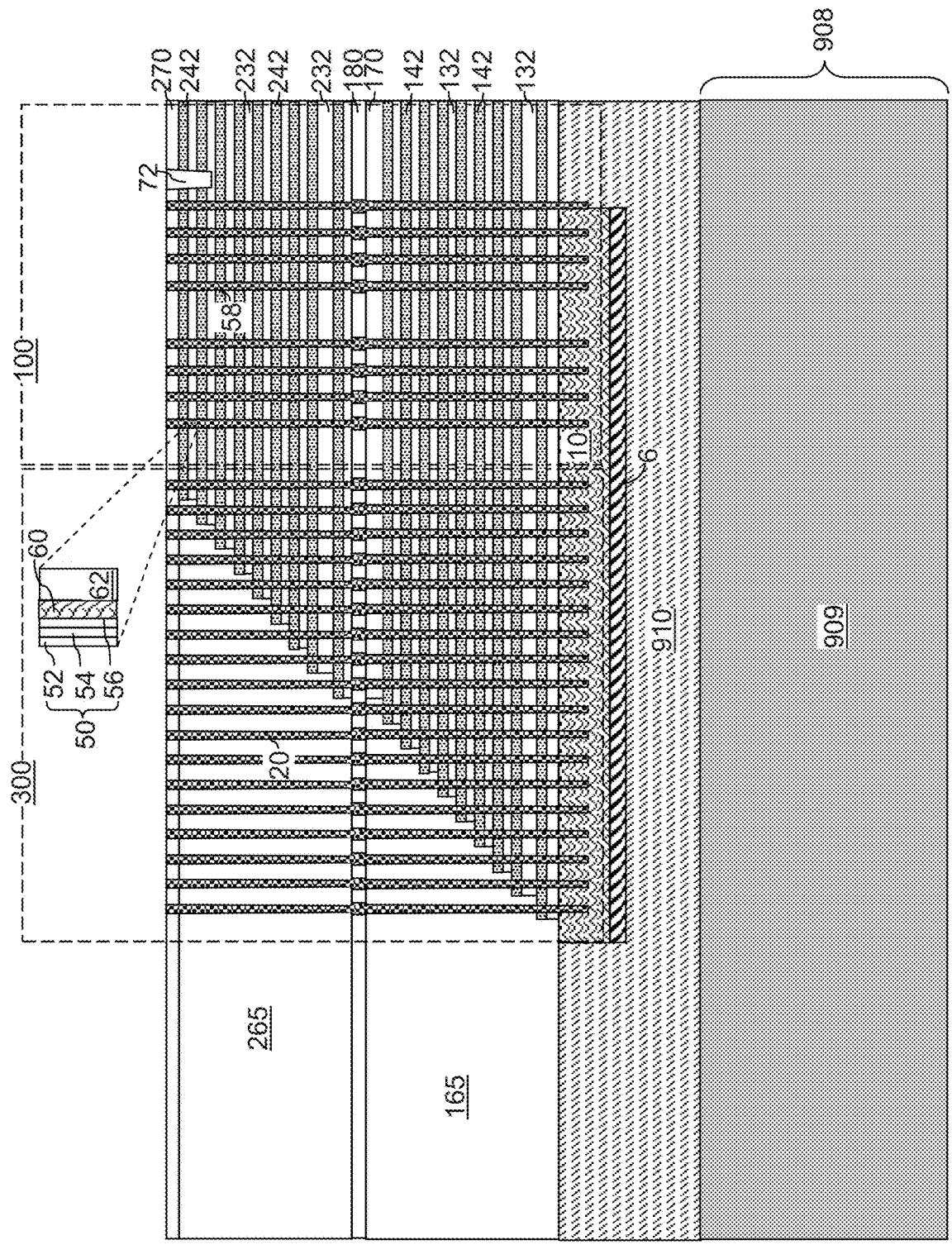
FIG. 10 is a vertical cross-sectional view of the exemplary structure after formation of memory opening fill structures and support pillar structures according to an embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
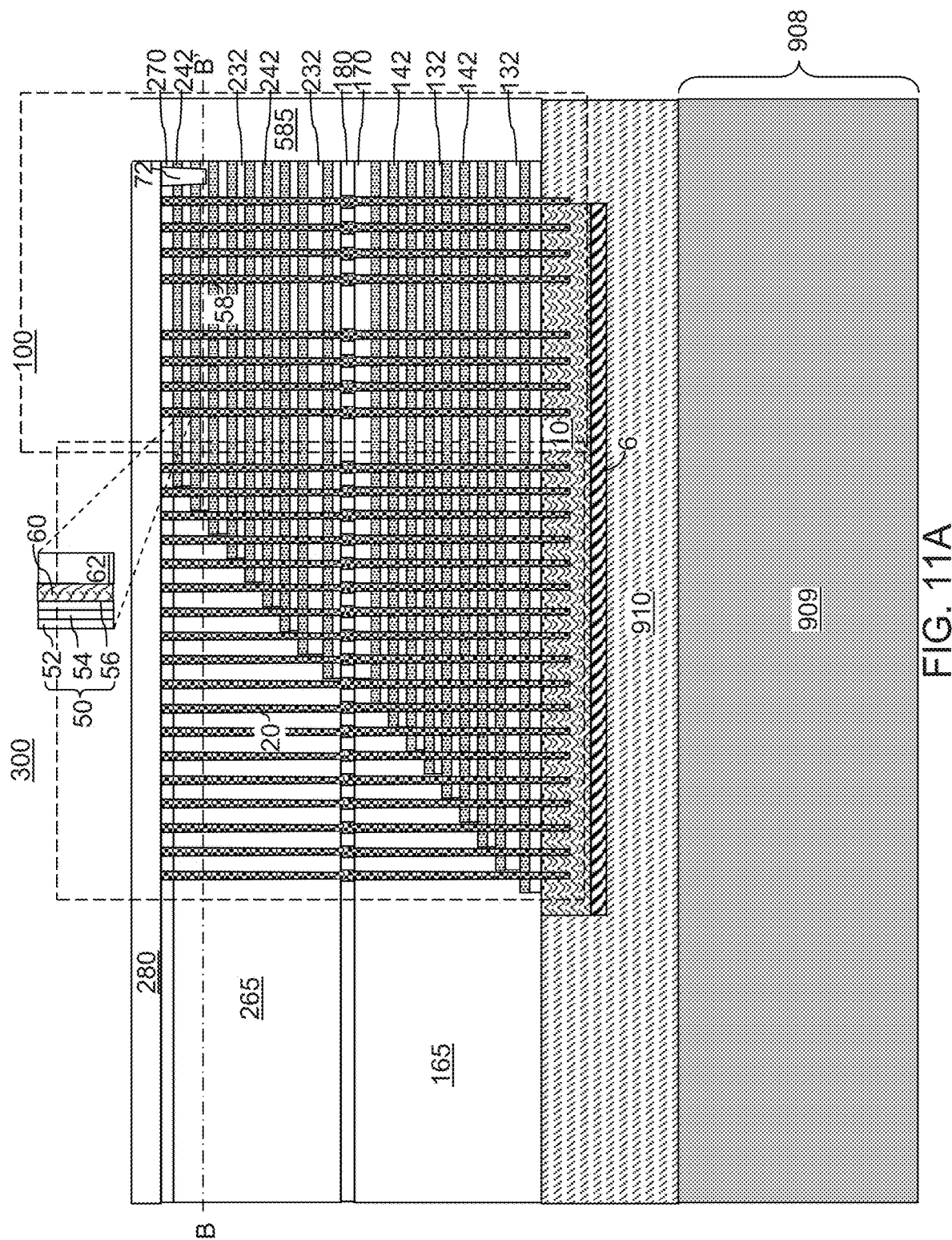
FIG. 11A is a vertical cross-sectional view of the exemplary structure after formation of pillar cavities according to an embodiment of the present disclosure.
Figure 11B:
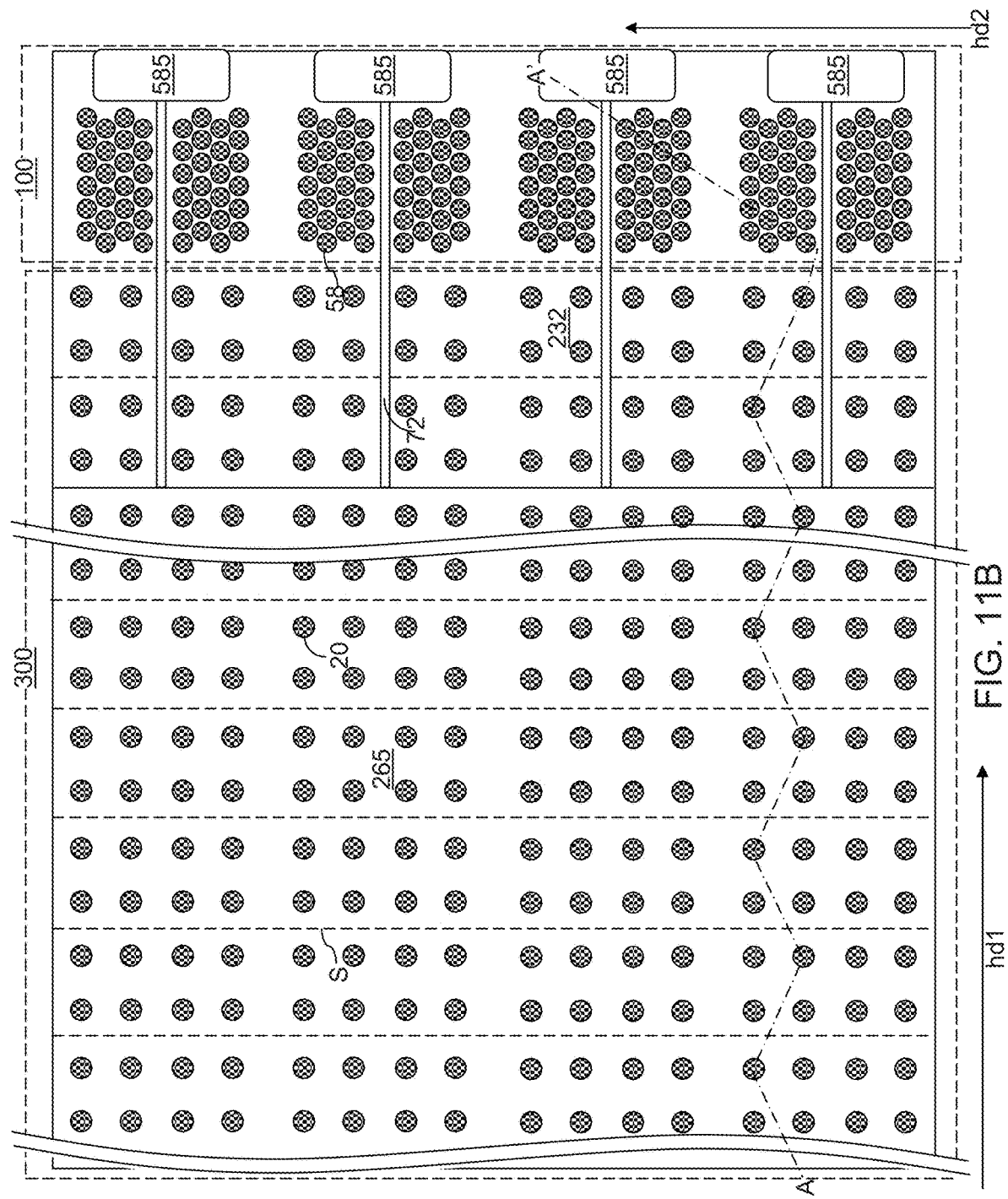
FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or nonconformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a source-side dielectric material layer 910 may be physically exposed at the bottom of each vertical interconnection region cavity 585. The photoresist layer may be removed, for example, by ashing.

Figure 12:
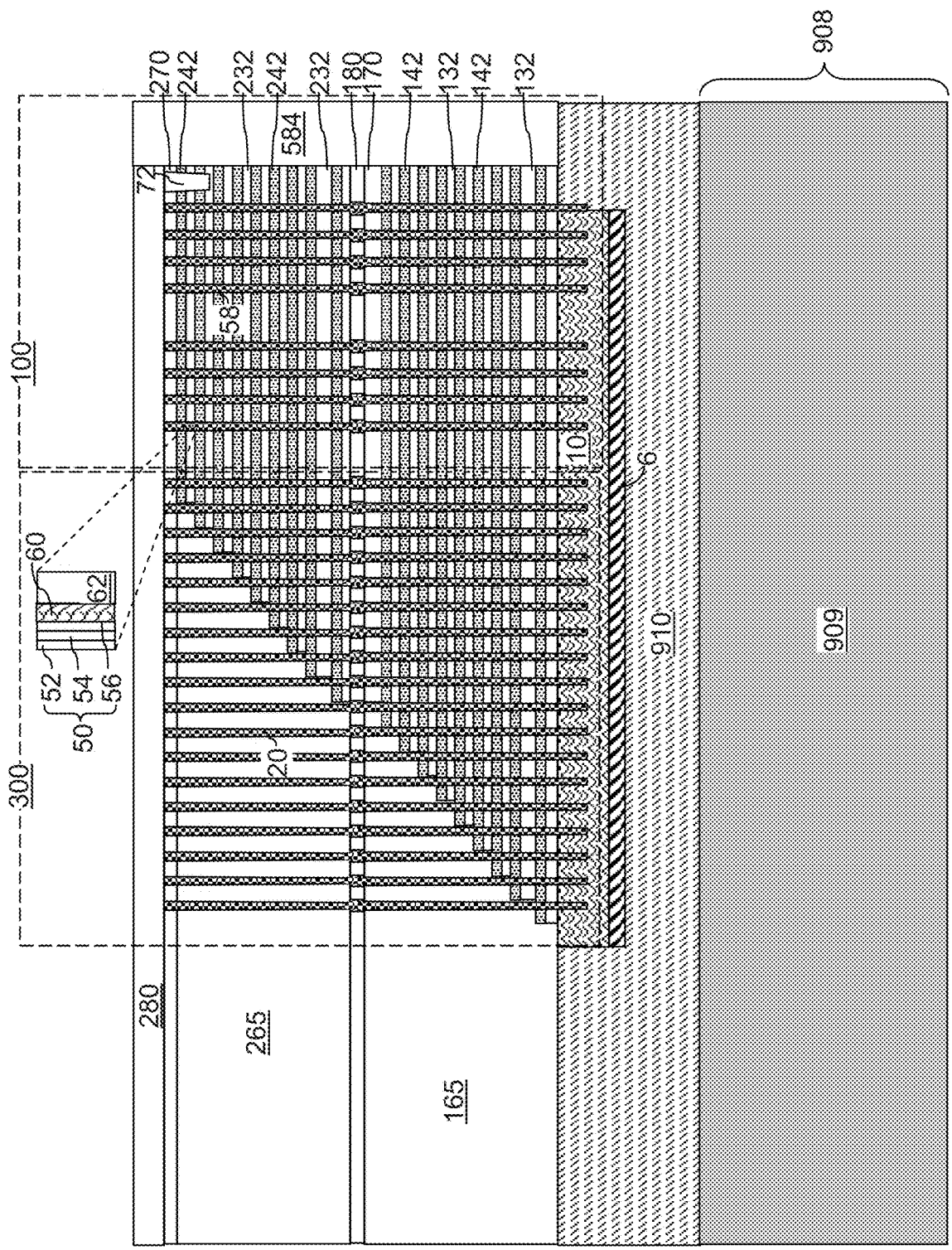
FIG. 12 is a vertical cross-sectional view of the exemplary structure after formation of dielectric pillar structures according to an embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 13A:
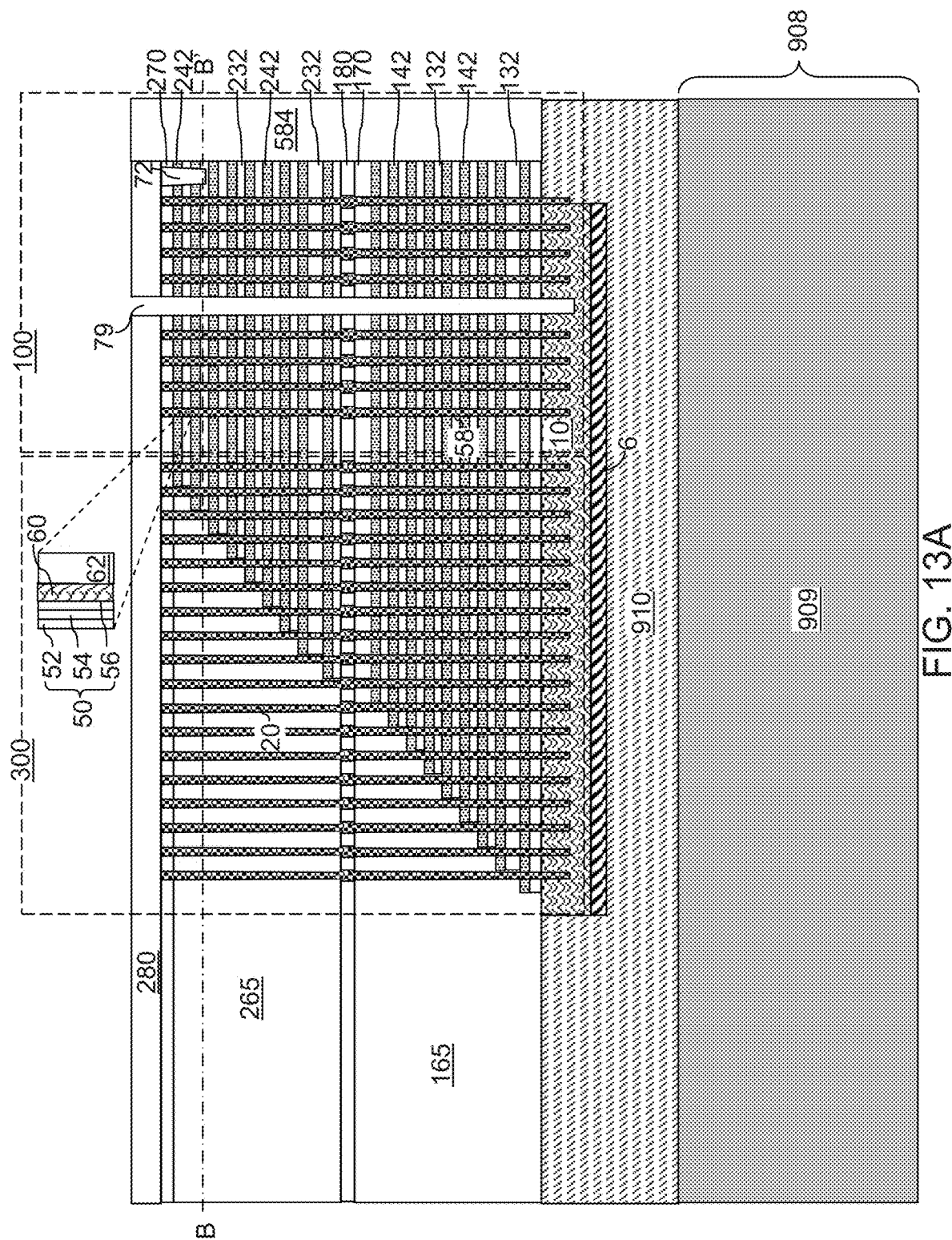
FIG. 13A is a vertical cross-sectional view of the exemplary structure after formation of a first contact-level dielectric layer and backside trenches according to an embodiment of the present disclosure.
Figure 13B:
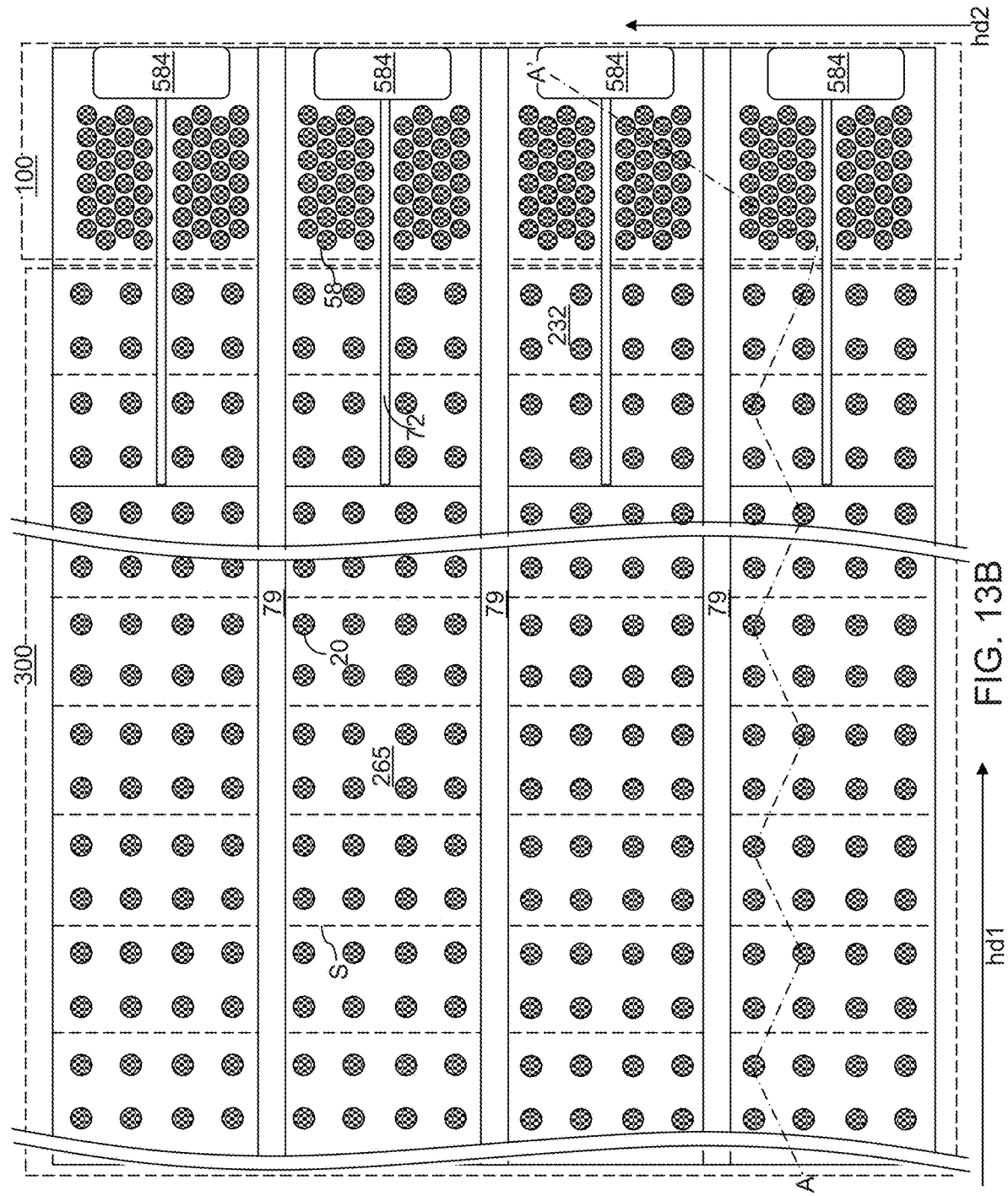
FIG. 13B is a horizontal cross-sectional of the exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact-level dielectric layer 280, the second-tier structure (232, 242, 270, 265, 72), and the first-tier structure (132, 142, 170, 165), and into the source semiconductor layer 10. Portions of the first contact-level dielectric layer 280, the second-tier structure (232, 242, 270, 265, 72), the first-tier structure (132, 142, 170, 165), and the source semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it may be desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the exemplary structure due to local layout variations of conductive components within the exemplary structure.

Figure 14:
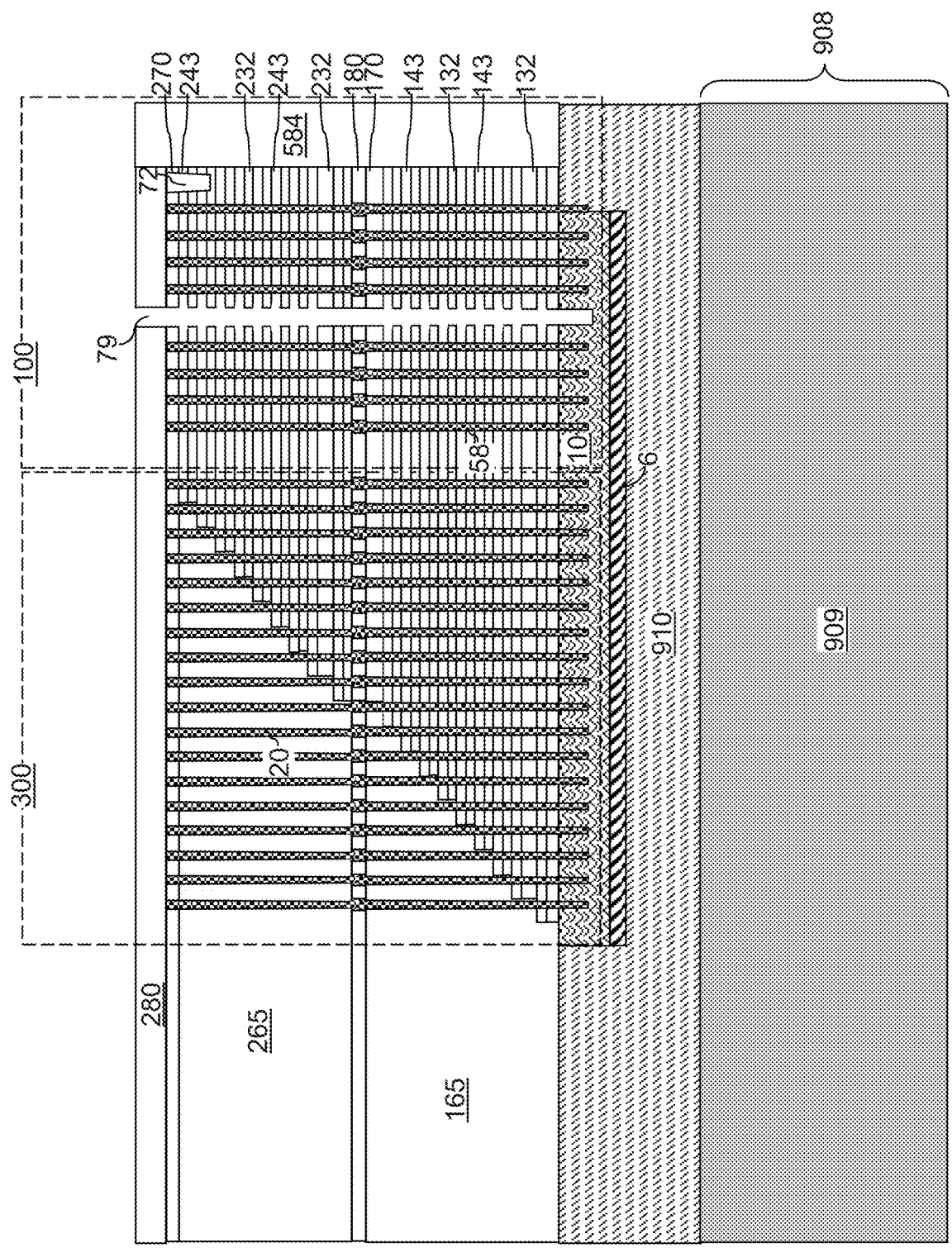
FIG. 14 is a vertical cross-sectional view of the exemplary structure after formation of backside recesses according to an embodiment of the present disclosure.

Referring to FIG. 14, the sacrificial material layers (142, 242) may be removed selective to the insulating layers (132, 232), the first and second insulating cap layers (170, 270), the first contact-level dielectric layer 280, and the source semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the carrier substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 15A:
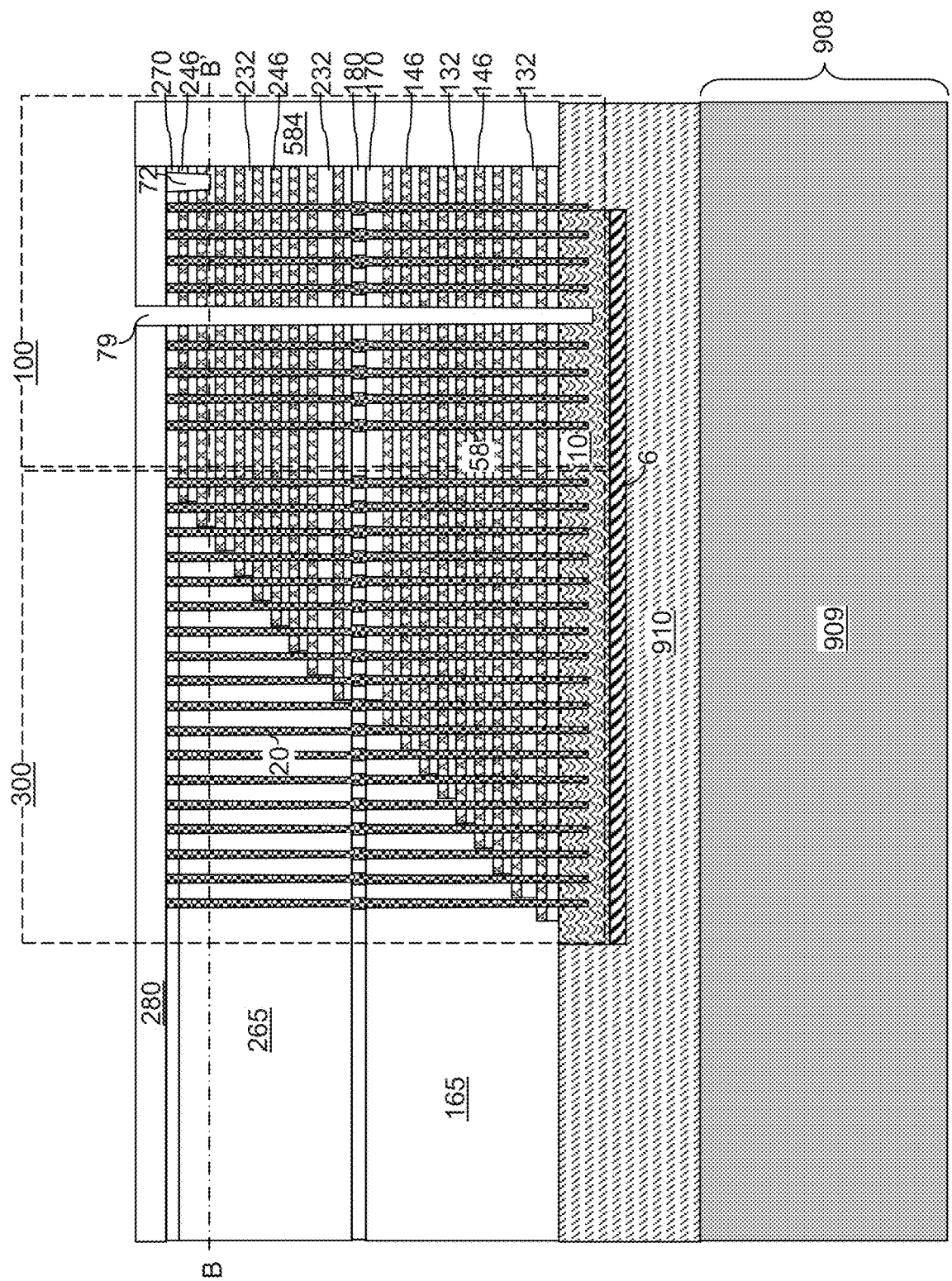
FIG. 15A is a vertical cross-sectional view of the exemplary structure after formation of electrically conductive layers according to an embodiment of the present disclosure.
Figure 15B:
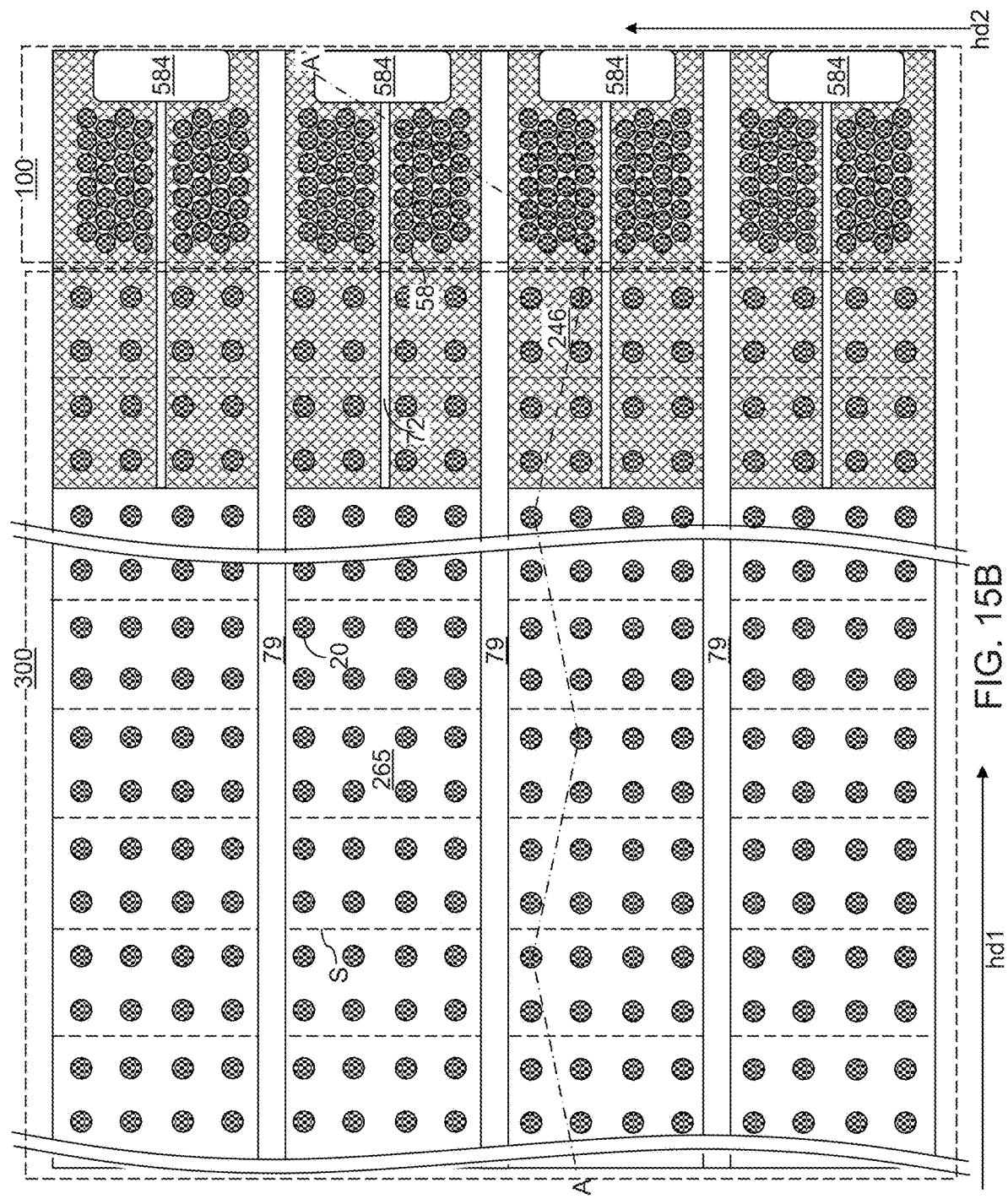
FIG. 15B is a horizontal cross-sectional of the exemplary structure along the horizontal plane B-B' of FIG. 15A. The hinged vertical plane A-A' corresponds to the plane of the vertical cross-sectional view of FIG. 15A.

Referring to FIGS. 15A and 15B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over the carrier substrate layer 909. The memory-level assembly includes at least one alternating stack (132, 146, 232, 246) and memory stack structures 55 vertically extending through the at least one alternating stack (132, 146, 232, 246).

Figure 16A:
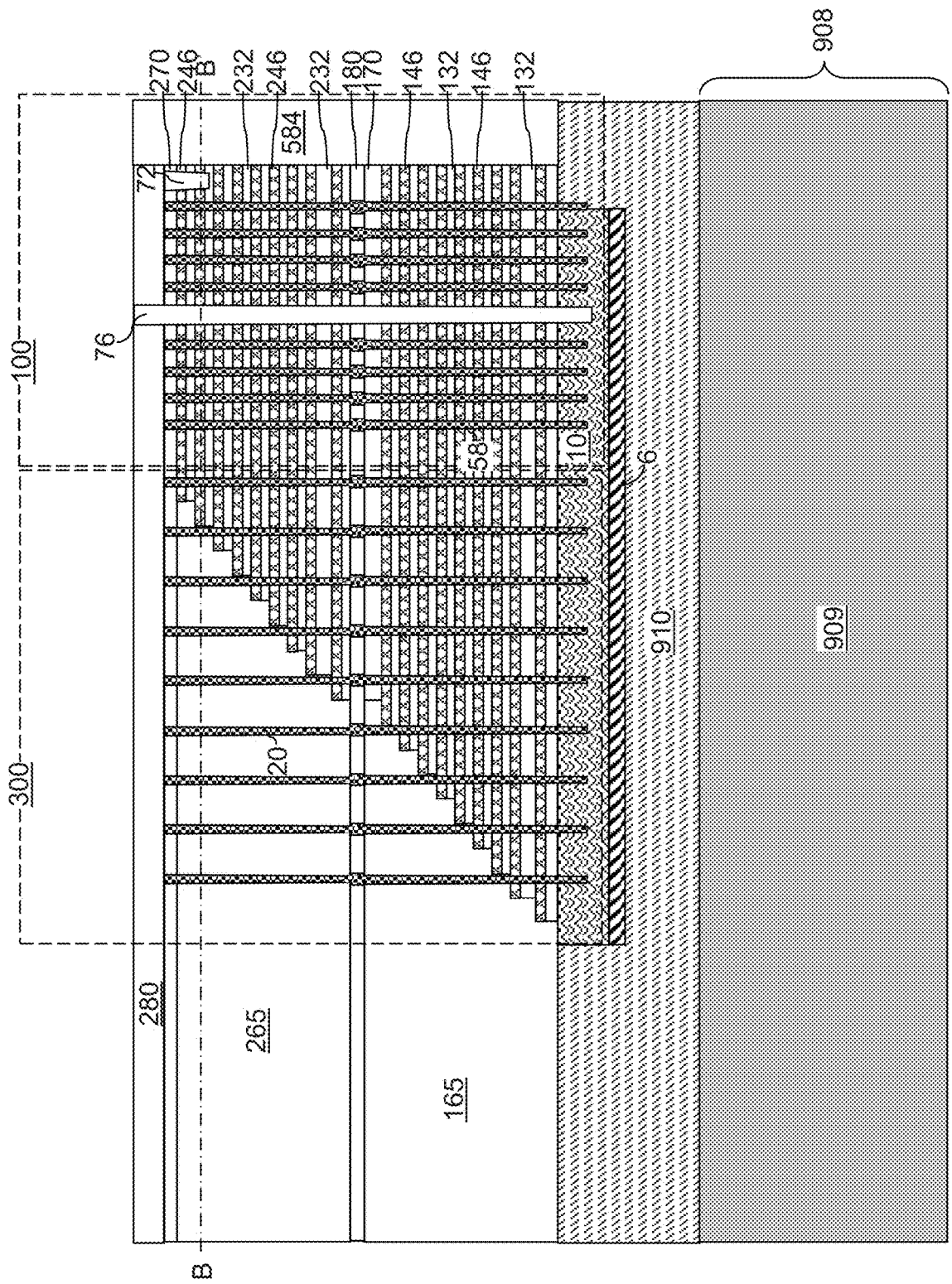
FIG. 16A is a vertical cross-sectional view of the exemplary structure after formation of backside trench fill structures in the backside trenches according to an embodiment of the present disclosure.
Figure 16B:
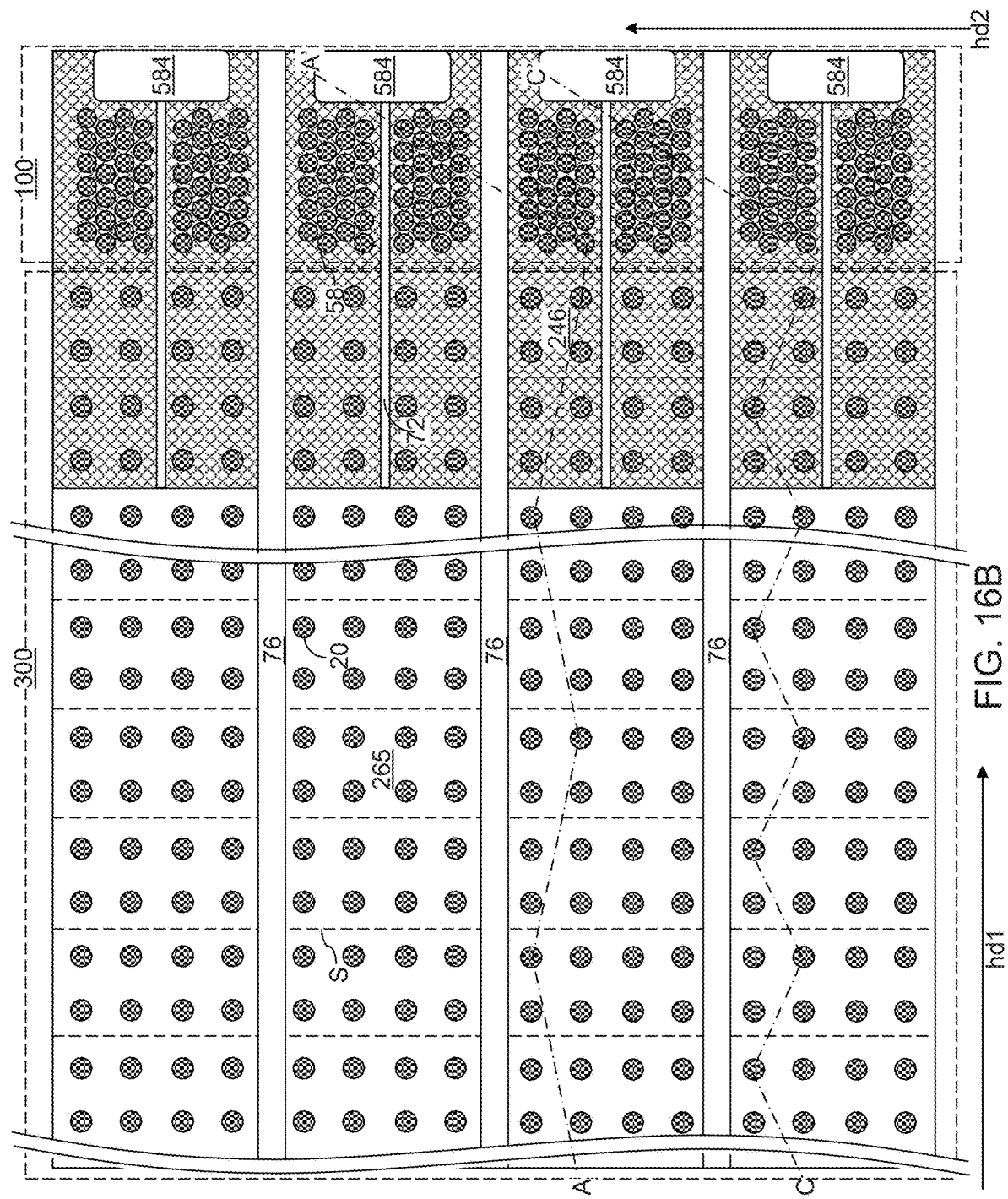
FIG. 16B is a horizontal cross-sectional of the exemplary structure along the horizontal plane B-B' of FIG. 16A. The hinged vertical plane A-A' corresponds to the plane of the vertical cross-sectional view of FIG. 16A.
Figure 16C:
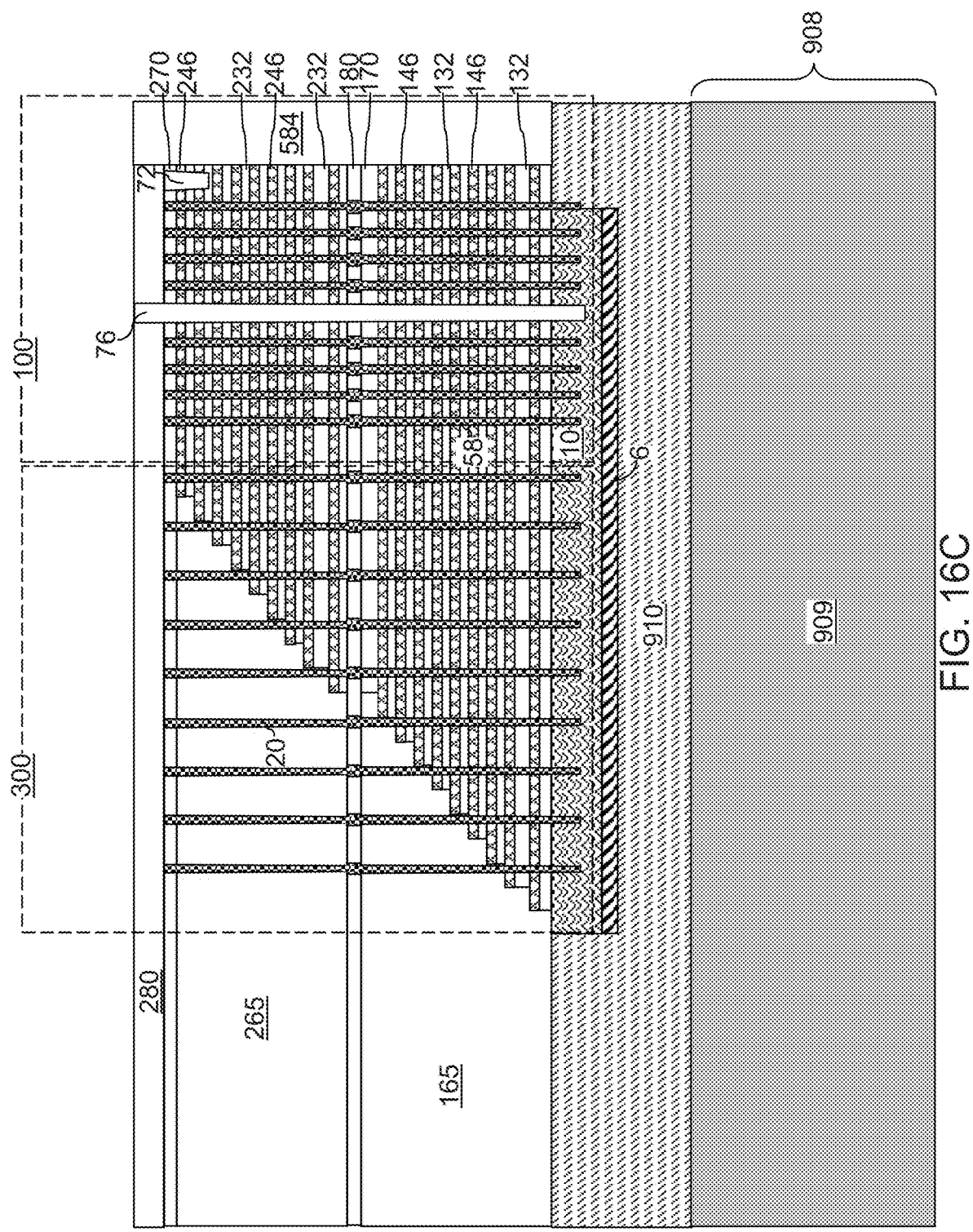
FIG. 16C is a vertical cross-sectional view of the exemplary structure along the vertical plane C-C' of FIG. 16B.

Referring to FIGS. 16A-16C, a backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the source semiconductor layer 10 and a dielectric spacer that laterally surrounds the conductive via structure.

Figure 17A:
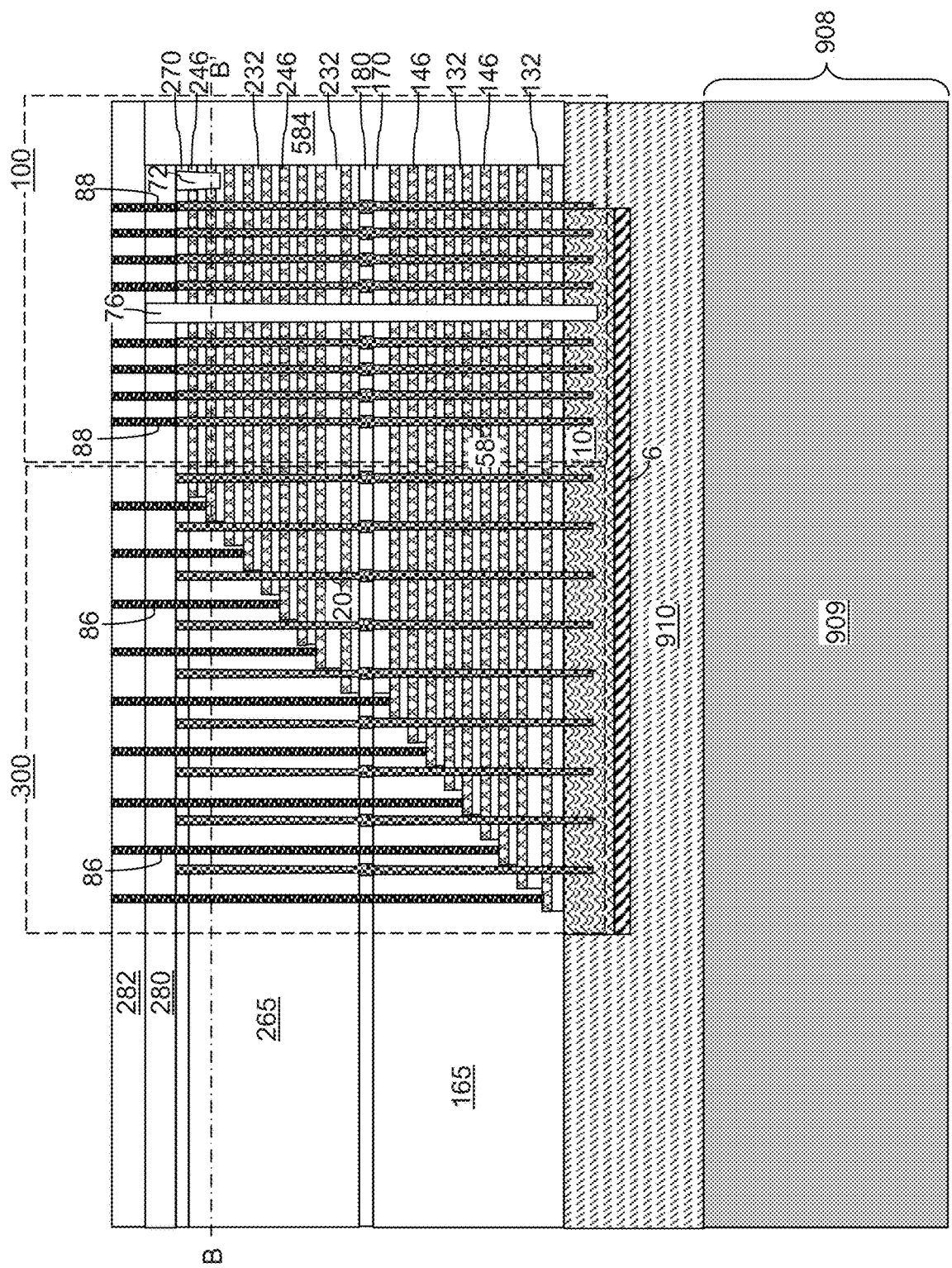
FIG. 17A is a vertical cross-sectional view of the exemplary structure after formation of a second contact-level dielectric layer and various contact via structures according to an embodiment of the present disclosure.
Figure 17B:
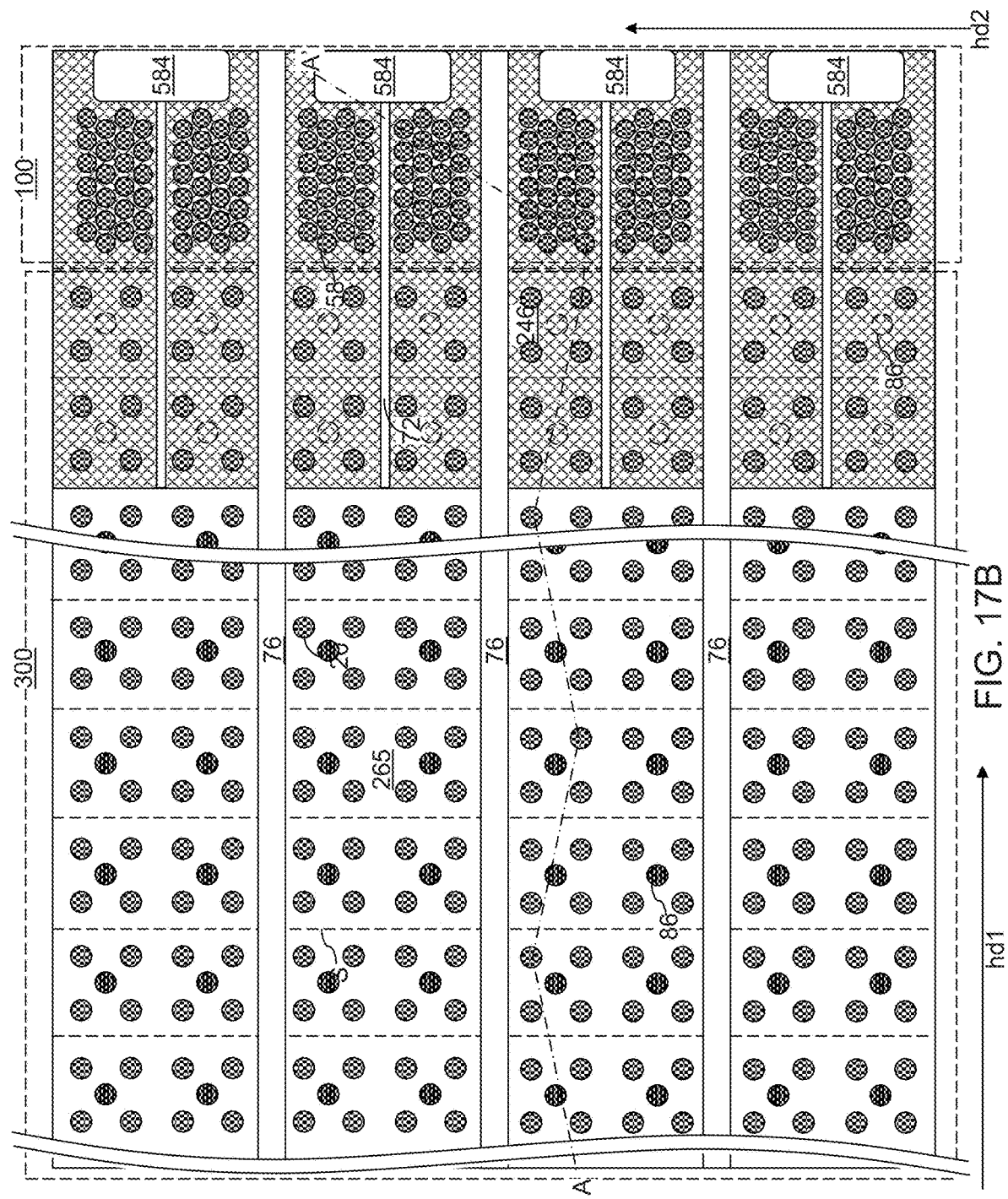
FIG. 17B is a horizontal cross-sectional view of the exemplary structure along the vertical plane B-B' of FIG. 17A. The hinged vertical plane A-A' corresponds to the plane of the vertical cross-sectional view of FIG. 17A.
Figure 18:
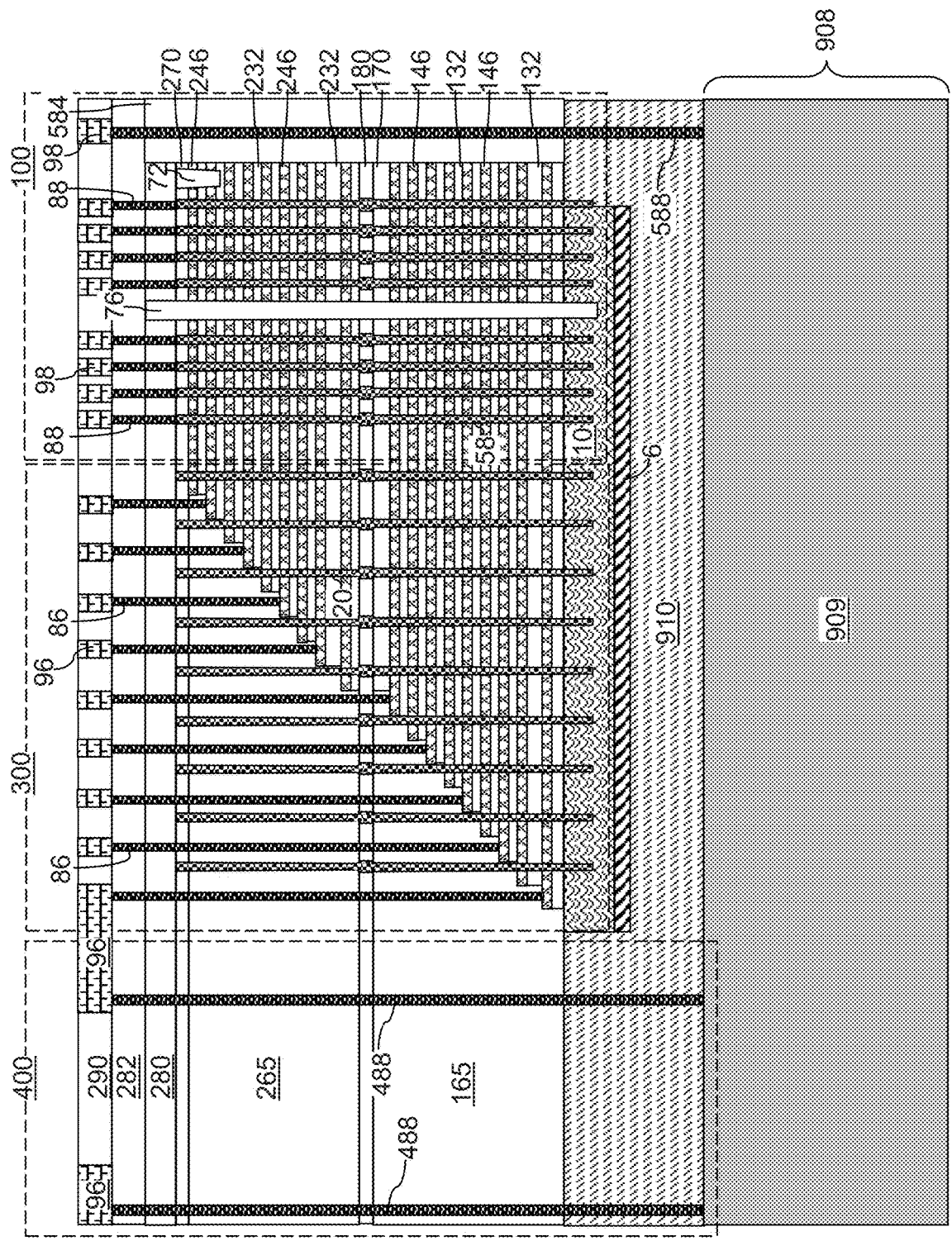
FIG. 18 is a vertical cross-sectional view of the exemplary structure after formation of first line-level metal interconnect structures according to an embodiment of the present disclosure.

Referring to FIGS. 17A and 17B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures 88 may be formed in the memory array region 100, and openings for forming staircase region contact via structures 86 may be formed in the staircase region 300. An anisotropic etch process may be performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Optional first through-memory-level via cavities may be formed through the second and first contact-level dielectric layers (282, 280), the second and first stepped dielectric material portions (265, 165), and the source-side dielectric material layer 910 to top surfaces of the carrier substrate layer 909 in the via interconnection region 400. Optional second through-memory-level via cavities may be formed through the interconnection region dielectric fill material portions 584 and the source-side dielectric material layer 910 to the top surface of the carrier substrate layer 909. At least one conductive material may be deposited in the first through-memory-level via cavities and in the second through-memory-level via cavities. Excess portions of the at least one conductive material may be removed from above the horizontal plane including the top surface of the second contact-level dielectric layer 282. Each remaining portion of the at least one conductive material in a first through-memory-level via cavity constitutes an optional first through-memory-level via structure 488. Each remaining portion of the at least one conductive material in a second through-memory-level via cavity constitutes an optional second through-memory-level via structure 588. The optional first through-memory-level via structure 488 and second through-memory-level via structure 588 may be used in the embodiment in which more than two chips (e.g., more than two die) are bonded together, as will be described with respect to FIGS. 23 and 24. In another embodiment, the first through-memory-level via structure 488 and second through-memory-level via structure 588 may be omitted, especially if only two chips (e.g., two die) are bonded together.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include first line-level metal interconnect structures (98, 96). The first line-level metal interconnect structures (98, 96) may include bit lines 98 contacting a respective one of the drain contact via structures 88, and interconnection line structures 96 contacting, and/or electrically connected to, at least one of the staircase-region contact via structures 86 and/or the first through-memory-level via structures 488 and/or the second through-memory-level via structures 588.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the carrier substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The electrically conductive strips (146, 246) comprise a plurality of control gate electrodes having a strip shape extending substantially parallel to the top surface of the carrier substrate 908, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the carrier substrate 908, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 19A:
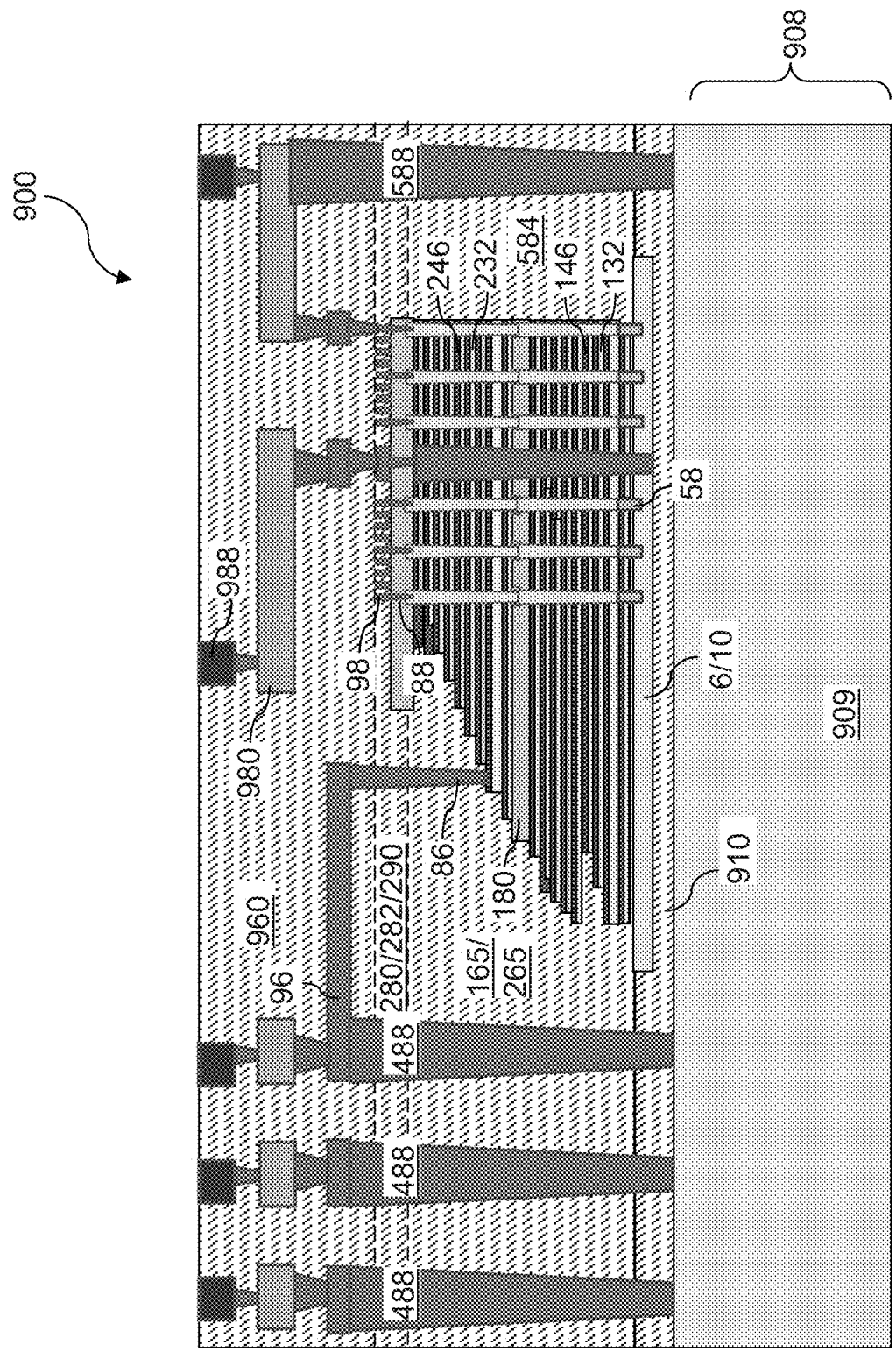
FIG. 19A is a vertical cross-sectional view of the exemplary structure after formation of memory-die dielectric material layers and memory-die bonding pads according to an embodiment of the present disclosure.
Figure 19B:
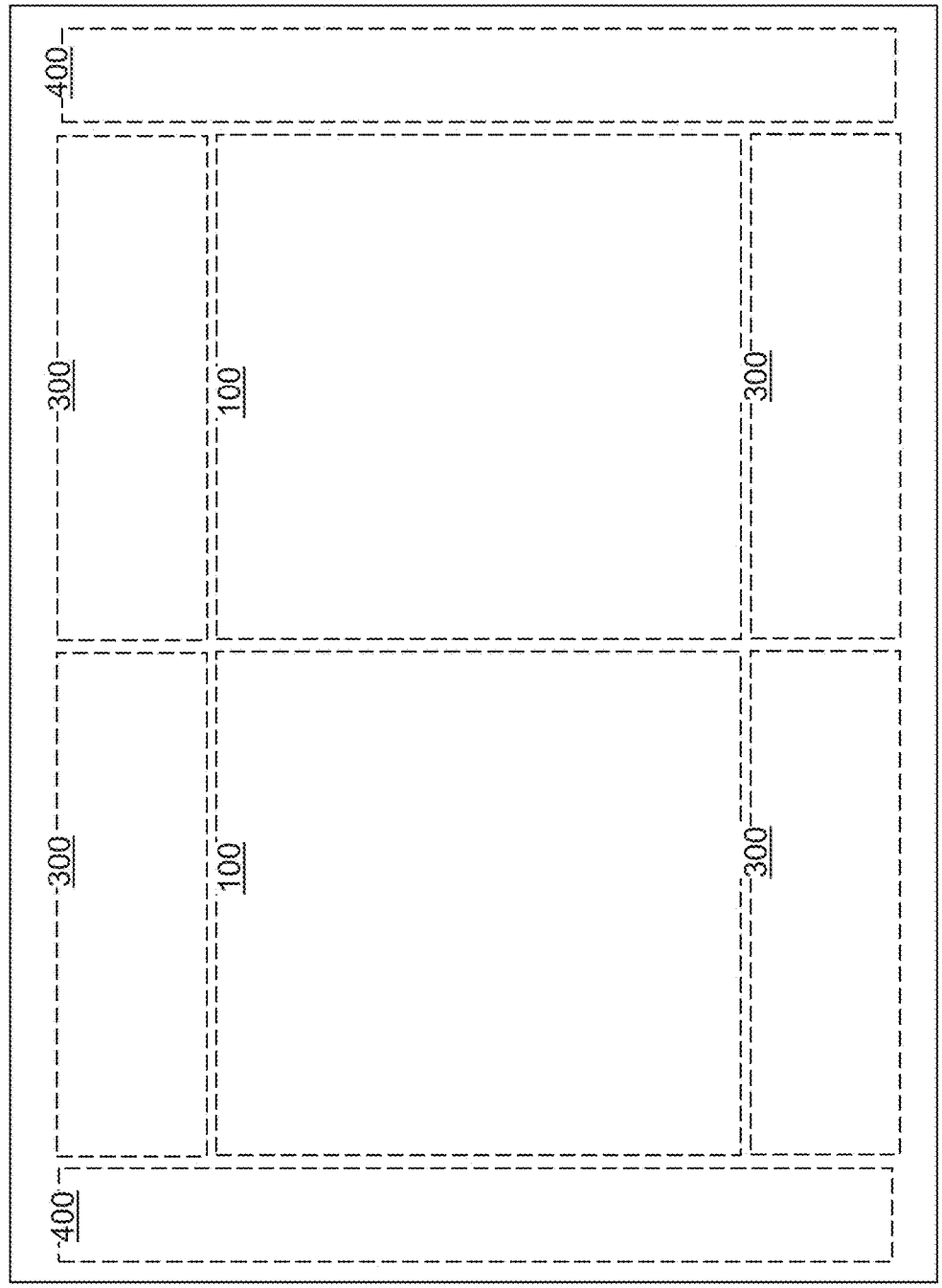
FIG. 19B is a layout of a memory die including the exemplary structure of FIG. 19A.

Referring to FIGS. 19A and 19B, memory-die dielectric material layers 960 may be deposited over the line-level dielectric layer 290. Various additional memory-die metal interconnect structures 980 may be formed in the memory-die dielectric material layers 960. Generally, the various metal interconnect structures (88, 86, 98, 96, 980) may be formed in the combination of the first contact-level dielectric layer 280, the second contact-level dielectric layer 282, the line-level dielectric layer 290, and the memory-die dielectric material layers 960 with appropriate shifting of metal interconnect levels. The thickness of the memory-die dielectric material layers 960 may be in a range from 300 nm to 3,000 nm, although lesser and greater thicknesses may also be used.

Pad cavities are formed in the upper portion of the additional memory-die metal interconnect structures 980 such that a respective one of the memory-die metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape.

A conductive material may be deposited in the pad cavities to form various memory-die bonding pads 988. The memory-die bonding pads 988 may include source-network memory-die bonding pads electrically connected to the source semiconductor layer 10, word-line-connection memory-die bonding pads that are electrically connected to a respective one of the electrically conductive layers (146, 246) that function word lines, and bit-line-connection memory-die bonding pads that are electrically connected to the bit lines 98. The exemplary structure comprises a memory die 900.

A plurality of memory dies 900 may be provided. Each of the memory dies 900 may include an alternating stack of insulating layers (132, 232) and word lines comprising a subset of the electrically conductive layers (146, 246). The alternating stack {(132, 146), (232, 246)} has stepped surfaces in which a subset of the electrically conductive layers (146, 246) has a lateral extent that increases with a distance from a bonding surface of the memory die 900 including the memory-die bonding pads 988. Memory stack structures 55 vertically extend through the alternating stack {(132, 146), (232, 246)}. Each of the memory stack structures 55 include a respective vertical semiconductor channel 60 and a respective set of vertically stacked memory elements located at levels of the electrically conductive layers (146, 246). Each set of vertically stacked memory elements may include portions of a charge storage layer 54 located at the levels of the electrically conductive layers (146, 246). Word line contact via structures (which are a subset of staircase-region contact via structures 86 that contact a subset of the electrically conductive layers 46 that function as word lines) may contact a respective one of the word lines. Each of the word line contact via structures vertically extend from a respective one of the word lines toward the bonding surface of the memory die 900.

Multiple instances of the memory die 900 may be provided with an identical design or with different designs. In case multiple instances of the memory die 900 are provided, the multiple instances of the memory die 900 are herein referred to as a first memory die (or a first die), a second memory die (or a second die), a third memory die (or a third die), etc. A three-dimensional memory device in the first memory die is herein referred to as a first three-dimensional memory device, a three-dimensional memory device in the second memory die is herein referred to as a second three-dimensional memory device, etc. The alternating stack of insulating layers (132, 232) and electrically conductive layers (146, 246) in the first memory die is herein referred to as a first-die alternating stack of first-die insulating layers and first-die electrically conductive layers, the alternating stack of insulating layers (132, 232) and electrically conductive layers (146, 246) in the second memory die is herein referred to as a second-die alternating stack of second-die insulating layers and second-die electrically conductive layers, and so on. The memory-die dielectric material layers 960 in the first memory die is herein referred to as first memory-die dielectric material layers, the memory-die dielectric material layers 960 in the second memory die is herein referred to as second memory-die dielectric material layers, and so on. The memory-die bonding pads 988 in the first memory die is herein referred to as first memory-die bonding pads, the memory-die bonding pads 988 in the second memory die is herein referred to as second memory-die bonding pads, and so on. Within each memory die 900, the memory-die bonding pads 988 are formed in the memory-die dielectric material layers 960, and are located on the alternating stack {(132, 146), (232, 246)} and on an opposite side of the semiconductor substrate of the respective memory die 900. The memory-die bonding pads 988 are electrically connected to nodes of the three-dimensional memory device in the memory die 900. In one embodiment, areas of the memory-die bonding pads 988 may overlap with the areas of the first through-memory-level via structure 488 and the second through-memory-level via structure 588 in a plan view, i.e., in a view along a direction that is perpendicular to the interface between the source semiconductor layer 10 and the alternating stack {(132, 146), (232, 246)}.

Generally, each memory die 900 includes at least one three-dimensional array of memory elements, memory-die metal interconnect structures 980 formed within memory-die dielectric material layers 960, and memory-die bonding pads 988 that are located on, or formed within, the memory-die dielectric material layers 960 and electrically connected to a respective node of the at least one three-dimensional array of memory elements. In one embodiment, each of the at least one three-dimensional array of memory elements includes an alternating stack of insulating layers (132, 232) and electrically conductive layers (146, 246) that are configured as word lines, memory stack structures 55 comprising a respective vertical stack of memory elements and a respective vertical semiconductor channel 60, bit lines 98 connected to a first end of a respective subset of the vertical semiconductor channels 60, and a source line (which may comprise a combination of the optional metallic plate layer 6 and the source semiconductor layer 10) connected to a second end of the vertical semiconductor channels 60.

Figure 20A:
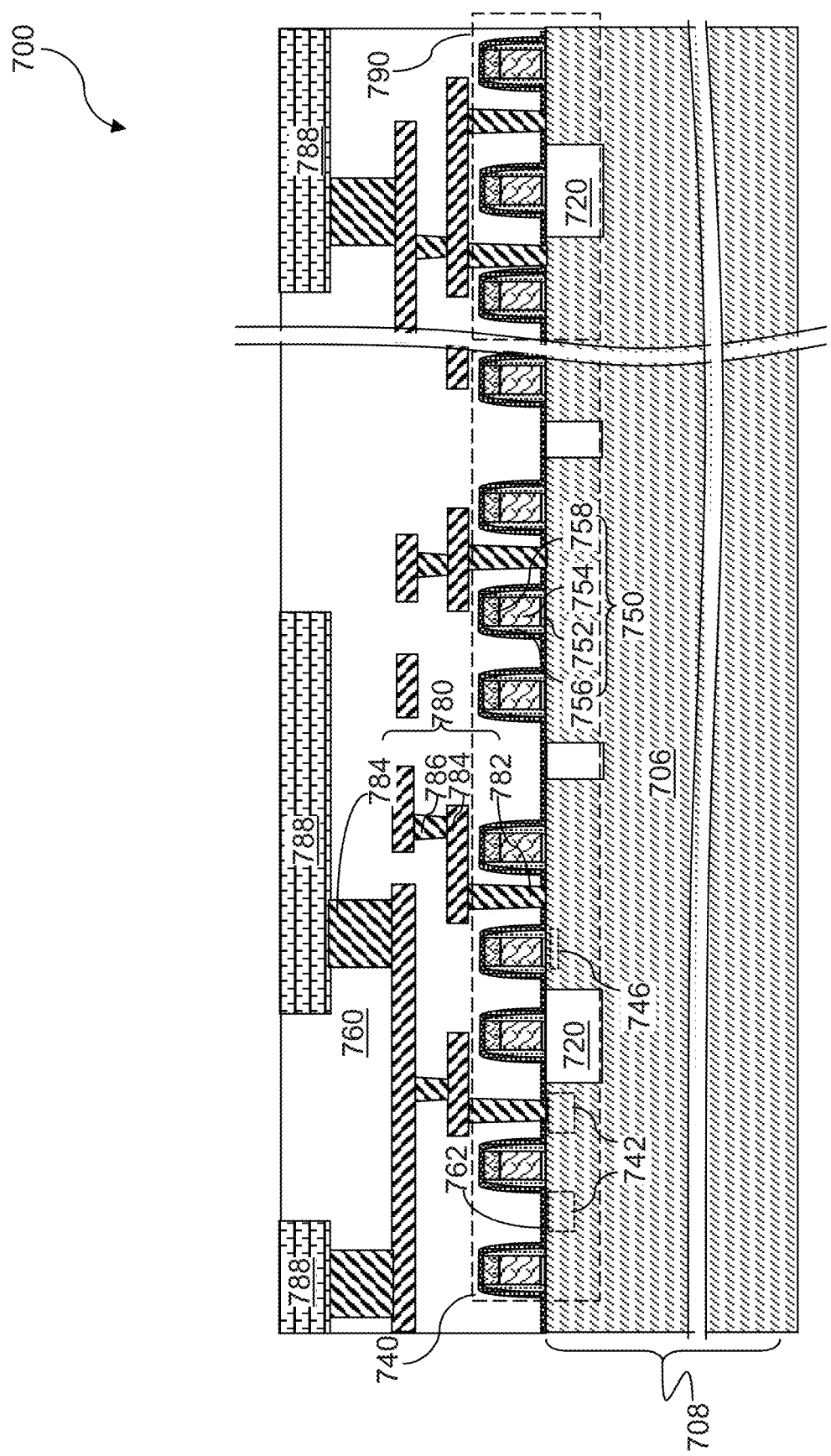
FIG. 20A is a vertical cross-sectional view of a support die according to an embodiment of the present disclosure.
Figure 20B:
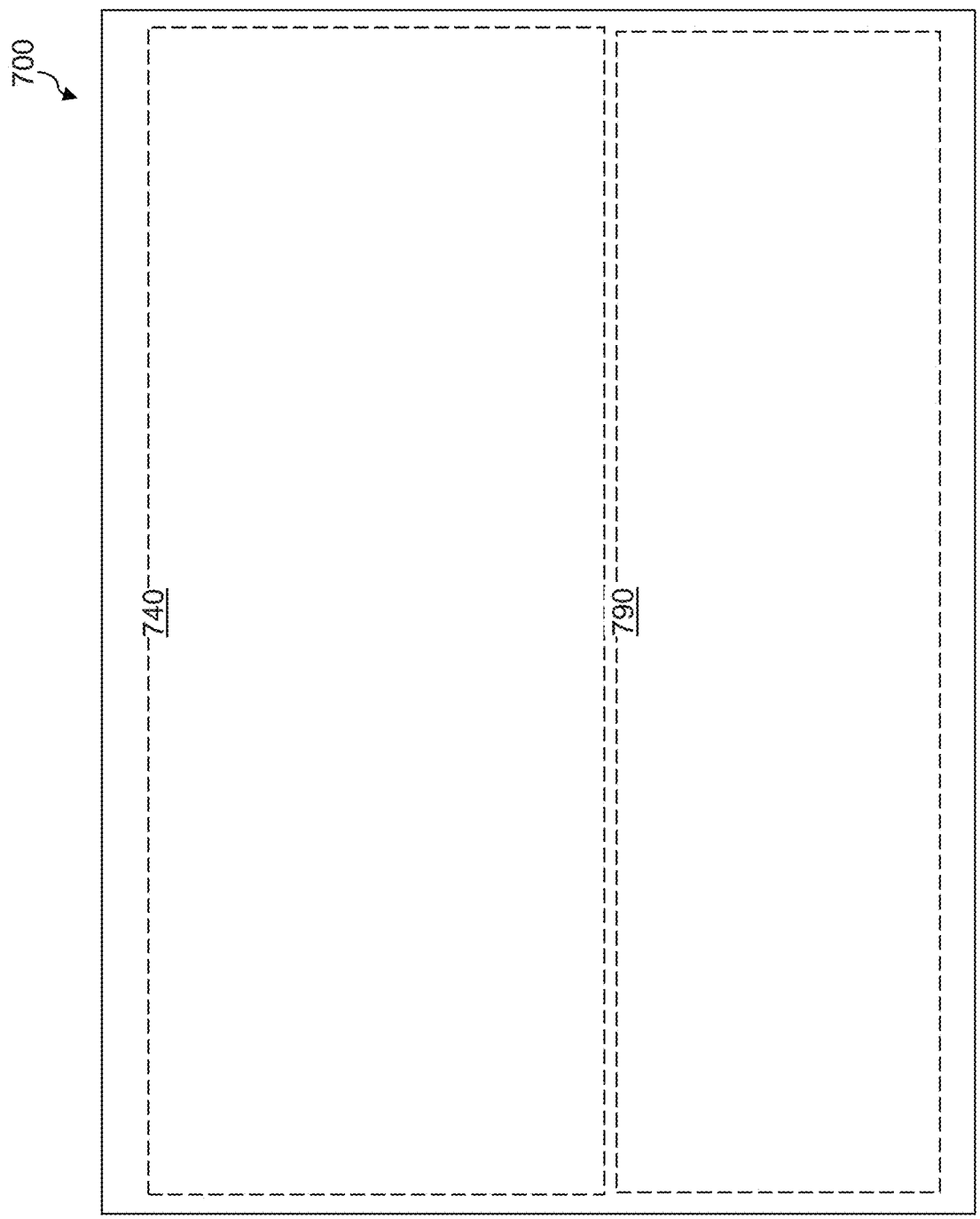
FIG. 20B is a layout of a support die of FIG. 20A.

Referring to FIGS. 20A and 20B, a support die 700 is provided, which comprises various semiconductor devices formed on a support-die substrate 708. The support-die substrate 708 includes a support-die semiconductor layer 706. The support-die semiconductor layer 706 may include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 may be provided in a surface region of the support-die semiconductor layer 706 to provide electrical isolation from semiconductor devices of the peripheral circuitry. The various semiconductor devices may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices may include word line drivers for electrically biasing word lines of the memory die 900, which comprise the electrically conductive layers (146, 246), and source power supply field effect transistors that generate power to be supplied to the source semiconductor layer in the memory die 900.

Dielectric material layers are formed over the semiconductor devices, which are herein referred to as support-die dielectric layers 760. Optionally, a dielectric liner 762 (such as a silicon nitride liner) may be formed to apply mechanical stress to the various field effect transistors and/or to prevent diffusion of hydrogen or impurities from the Support-die dielectric layers 760 into the semiconductor devices. Support-die metal interconnect structures 780 are formed within the support-die dielectric layers 760. The support-die metal interconnect structures 780 may include various device contact via structures 782 (e.g., source and drain electrodes which contact the respective source and drain nodes of the device or gate electrode contacts), memory-die metal line structures 784, memory-die metal via structures 786, and support-die bonding pads 788. The support-die bonding pads 788 may be located on, or formed within, support-die dielectric material layers. The support-die bonding pads 788 may be electrically connected to a respective node of the at least one peripheral circuitry 740 of the support die 700. The support-die bonding pads 788 are configured to mate with the memory-die bonding pads 988 of a memory die 900, or to backside bonding pads to be subsequently formed on a memory die 900, to provide electrically conductive paths between the memory die 900 and the support die 700.

In one embodiment, the semiconductor devices of the support die 700 may include complementary metal-oxide-semiconductor (CMOS) devices. The semiconductor devices include at least one peripheral circuitry 740 for operation of each three-dimensional memory arrays in at least one memory die 900 and a functional module 790 configured to provide a functionality that is independent of operation of any three-dimensional array of memory elements. For example, the at least one peripheral circuitry 740 may include CMOS devices and be configured to generate control signals for, and receive sense signals from, at least one three-dimensional array of memory elements provided in at least one memory die 900. In one embodiment, the at least one peripheral circuitry 740 may include a plurality of peripheral circuitries 740 that are configured to generate control signals for, and receive sense signals from, a plurality of three-dimensional arrays of memory elements provided in a single memory die 900 or in a plurality of memory dies 900.

Each peripheral circuitry 740 may include a word line driver that drives word lines of a three-dimensional memory array (comprising the electrically conductive layers (146, 246)) within a memory die 900, a bit line driver that drives the bit lines 98 in the memory die 900, a word line decoder circuit that decodes the addresses for the electrically conductive layers (146, 246), a bit line decoder circuit that decodes the addresses for the bit lines 98, a sense amplifier circuit that senses the states of memory elements within the memory stack structures 55 in the memory die 900, a source power supply circuit that provides power to the source semiconductor layer 10 in the memory die 900, a data buffer and/or latch, or any other semiconductor circuit that may be used to operate the array of memory stack structures 55 in the memory die 900.

Generally, a peripheral circuitry 740 for driving each three-dimensional array of memory elements within a memory die 900 having a respective area (which is herein referred to as a memory dies area) that may use significantly less area than the memory die area. The area for the peripheral circuitry 740 may be in a range from 10% to 80%, such as from 20% to 60%, of the memory die area of the memory die 900 that includes an entire set of at least one three-dimensional array of memory elements controlled by the peripheral circuitry 740. Thus, if a support die 700 having a comparable size or the same size as a memory die 900, a functional module 790 may be formed in areas that are not taken up by the at least one peripheral circuitry 740 of the support die 700.

In one embodiment, the functional module 790 of the support die 700 may include a system level controller module configured to control operation of an additional die that is not a memory die. In this case, the additional die is not included in a bonded assembly including the support die 700 and at least one memory die 900, and may be attached to a same printed circuit board (PCB) that the bonded assembly including the support die 700 and the at least one memory die 900 is attached to.

Additionally, or alternatively, the functional module 790 may include an error correction code (ECC) module that is configured to detect and correct data corruption in the at least one three-dimensional array of memory elements in a memory die 900 to which the support die 700 may be subsequently bonded to.

Additionally, or alternatively, the functional module 790 may include a memory module configured to interface with an external processor module located outside of a bonded assembly including the support die 700 and at least one memory die 900 and attached to the same PCB as the support die 700. The memory module may be selected from, but is not limited to, a dynamic random access memory module, a static random access memory module, a two-dimensional NAND memory module, and a storage class memory (SCM) module.

Additionally, or alternatively, the functional module 790 may include a module selected from a microprocessor unit module that comprises a central processing unit and a memory management unit and a wireless communication module configured to generate or receive wireless signals.

Figure 21:
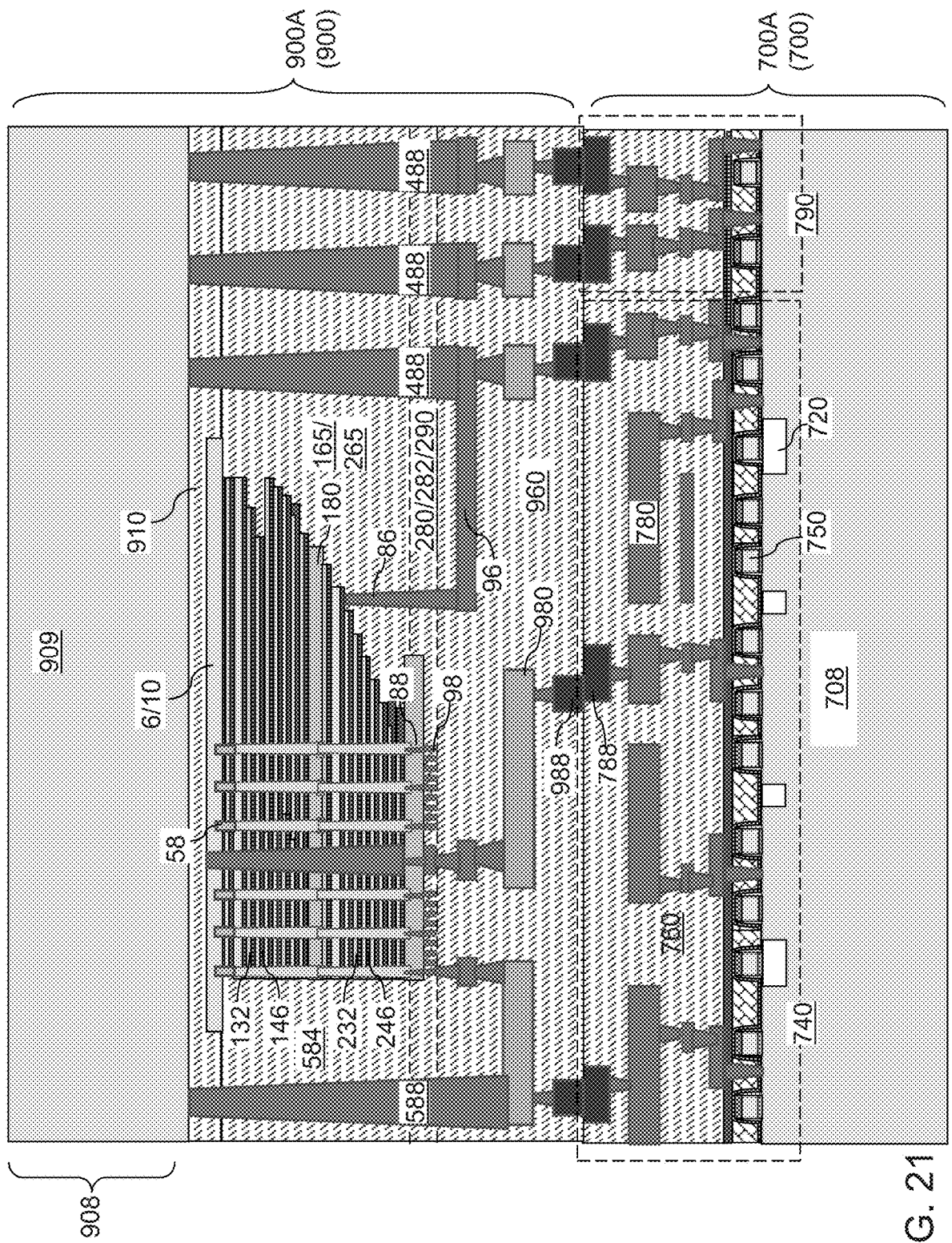
FIG. 21 is a vertical cross-sectional view of a first exemplary bonded assembly formed by bonding the memory die of FIGS. 19A and 19B and the support die of FIGS. 20A and 20B according to an embodiment of the present disclosure.

Referring to FIG. 21, a first exemplary bonded assembly according to an embodiment of the present disclosure is illustrated, which may be formed by bonding the memory-die bonding pads 988 of a first memory die 900A (which is an instance of the memory die 900 illustrated in FIGS. 19A and 19B) to the support-die bonding pads 788 of a first support die 700A (which is an instance of the support die 700 illustrated in FIGS. 20A and 20B). Metal-to-metal bonding may be used to bond the first memory die 900A to the first support die 700A.

Figure 22:
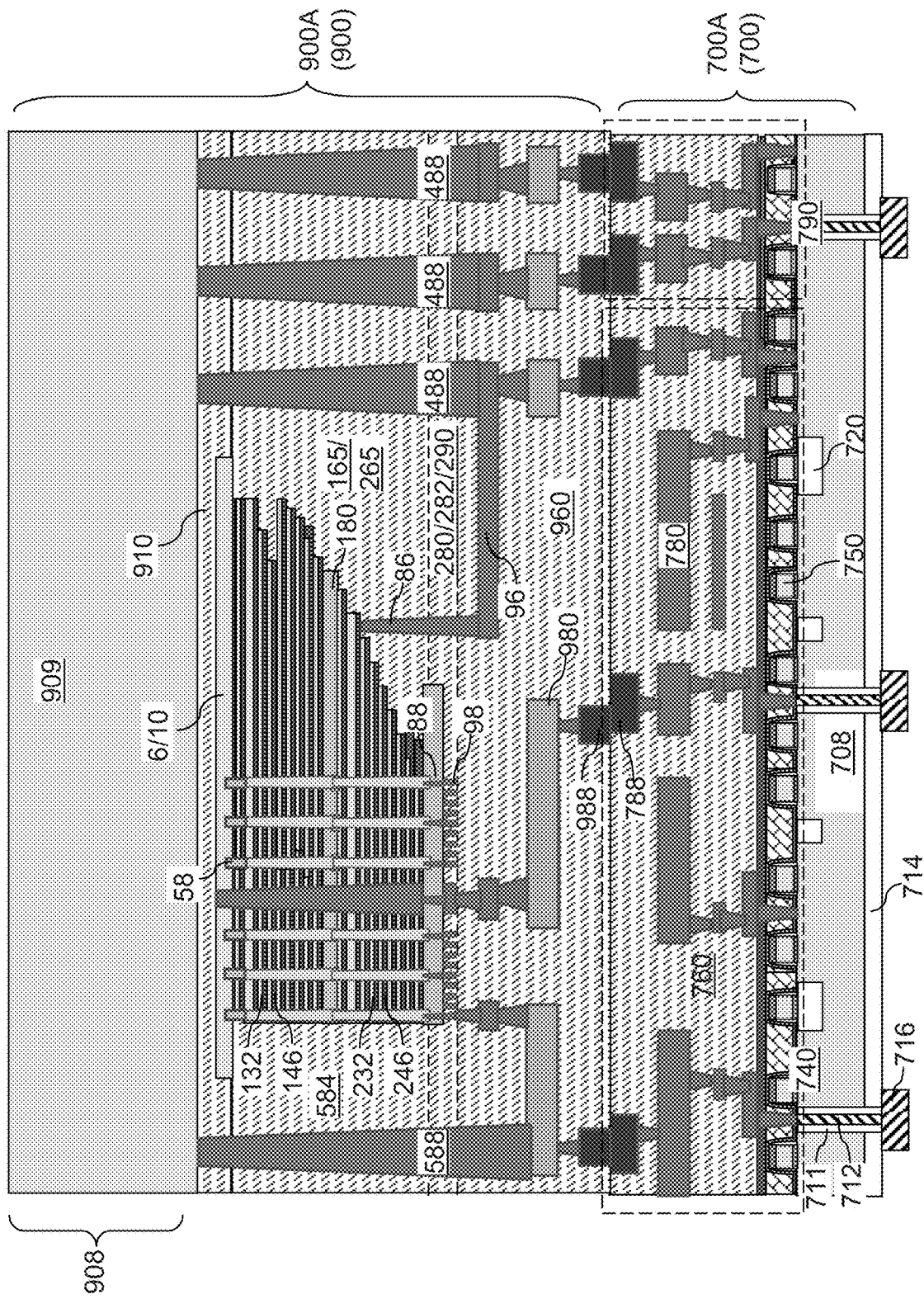
FIG. 22 is a vertical cross-sectional view of the first exemplary bonded assembly after formation of through-substrate via structures and backside bonding pads according to an embodiment of the present disclosure.

Referring to FIG. 22, the support-die substrate 708 may be thinned from the backside of the support-die substrate 708. A grinding process, a wet etch process, a polishing process, and/or a dry etch process may be used to thin the support-die substrate 708. The thickness of the support-die substrate 708 as thinned may be in a range from 500 nm to 20 microns, although lesser and greater thicknesses may also be used.

A support-die backside insulating layer 714 may be deposited on the backside surface of the thinned support-die substrate 708. The support-die backside insulating layer 714 includes a dielectric material such as silicon oxide, and may have a thickness in a range from 30 nm to 1,000 nm, although lesser and greater thicknesses may also be used. A photoresist layer (not shown) may be applied over the backside of the thinned support-die substrate 708, and is lithographically patterned to form openings therein. The openings in the photoresist layer may be formed directly above a respective one of the support-die metal interconnect structures 780.

An anisotropic etch process may be performed using the photoresist layer as an etch mask layer to etch through the thinned support-die substrate 708 to a surface of a respective one of the support-die metal interconnect structures 780. Through-substrate via cavities are formed through the support-die backside insulating layer 714 and the thinned support-die substrate 708. The photoresist layer may be subsequently removed, for example, by ashing. An insulating liner layer may be deposited in the through-substrate via cavities and over the support-die backside insulating layer 714. Horizontal portions of the insulating liner layer may be removed from above the support-die backside insulating layer 714 by an anisotropic etch process. Each remaining tubular portion of the insulating liner layer constitutes a tubular insulating spacer 711. The tubular insulating spacers 711 include a dielectric material such as silicon oxide, and may have a lateral thickness in a range from 10 nm to 300 nm between an inner sidewall and an outer sidewall. At least one conductive material such as a combination of a metallic liner (e.g., TiN) and a metallic fill material (e.g., W) may be deposited in remaining volumes of the through-substrate via cavities to form through-substrate via structures 712.

Support-die backside bonding pads 716 may be formed directly on a respective one of the through-substrate via structures 712. Optionally, the support-die backside bonding pads 716 may have a mirror image pattern of the pattern of the front support-die bonding pads 788. Each combination of a through-substrate via structure 712 and a support-die backside bonding pad 716 constitutes a backside bonding structure (712, 716). Each of the backside bonding structures (712, 716) may comprise a through-substrate via structure 712 extending through a semiconductor substrate (comprising the support-die substrate 708) of the first support die 700A and laterally electrically insulated from the semiconductor substrate by a tubular insulating spacer 711, and a support-die backside bonding pad 716 contacting the through-substrate via structure 712.

Figure 23:
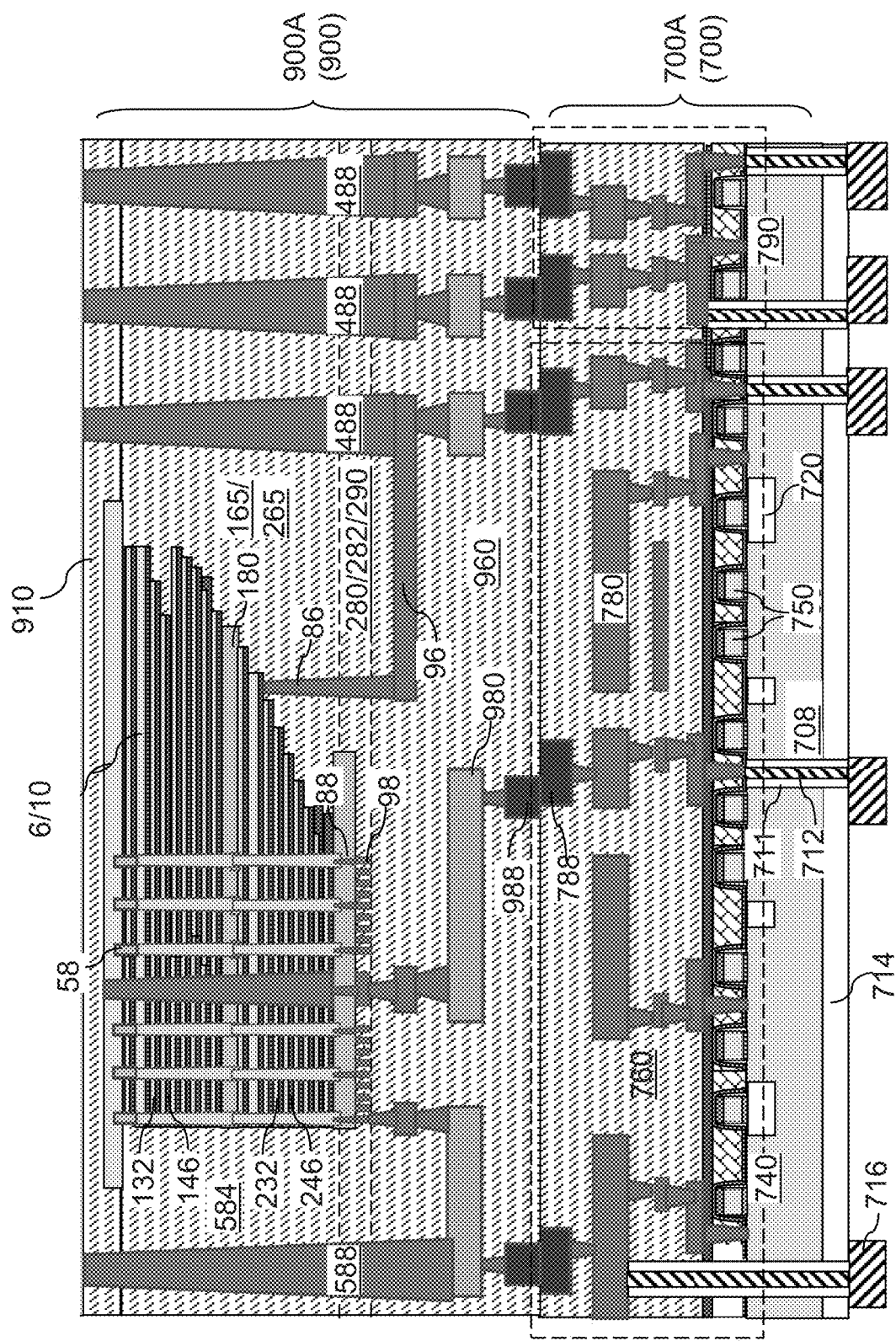
FIG. 23 is a vertical cross-sectional view of the first exemplary bonded assembly after removal of a substrate of the memory die according to an embodiment of the present disclosure.

Referring to FIG. 23, the carrier substrate layer 909 may be removed from the first exemplary bonded assembly (700A, 900A). A grinding process, a wet etch process, a polishing process, and/or a dry etch process may be used to remove the carrier substrate layer 909. In an illustrative example, a grinding process may remove a predominant portion of the carrier substrate layer 909, and the touch-up wet etch process may apply a chemical that removes the material of the carrier substrate layer 909 selective to the material of the source-side dielectric material layer 910. For example, if the carrier substrate layer 909 includes silicon, a wet etch process using a KOH solution may be used to remove the carrier substrate layer 909 selective to the material of the source-side dielectric material layer 910.

Referring to all drawings from FIG. 1 to FIG. 23, a bonded assembly including a first memory die 900A and a first support die 700A may be formed according to embodiments of the present disclosure. The first memory die 900A comprising at least one first three-dimensional array of memory elements, first memory-die metal interconnect structures 980 formed within first memory-die dielectric material layers 960, and first memory-die bonding 988 pads that are located on, or formed within, the first memory-die dielectric material layers 960 and electrically connected to a respective node of the at least one first three-dimensional array of memory elements. The first support die 700A includes at least one first peripheral circuitry 740 including complementary metal-oxide-semiconductor (CMOS) devices and configured to generate control signals for, and receive sense signals from, the at least one first three-dimensional array of memory elements and a first functional module 790 configured to provide a functionality that is independent of operation of the at least one first three-dimensional array of memory elements. The first support die 700A comprises first support-die bonding pads 788 that are located on, or formed within, first support-die dielectric material layers 760, electrically connected to a respective node of the at least one first peripheral circuitry 740, and bonded to the first memory-die bonding pads 988.

In one embodiment, at least a subset of the support-die backside bonding pads 716 may be external bonding pads that may be bonded to a printed circuit board through solder balls and/or bonding wires. In one embodiment, the first support die 700A comprises first external bonding pads that include a subset of the support-die backside bonding pads 716. A first subset of the first external bonding pads may be electrically connected to a respective node of the at least one first peripheral circuitry 740 in the first support die 700A, and a second subset of the first external bonding pads may be electrically connected to a respective node of devices of the first functional module 790 in the first support die 700A.

In one embodiment, first through-substrate via structures 712 may extend through a substrate of the first support die 700A and may provide electrical connections between the first external bonding pads and nodes of the at least one first peripheral circuitry 740, and second through-substrate via structures 712 may extend through the substrate of the first support die 700A and may provide electrical connection between the second external bonding pads and the nodes of devices of the first functional module 790.

Figure 24:
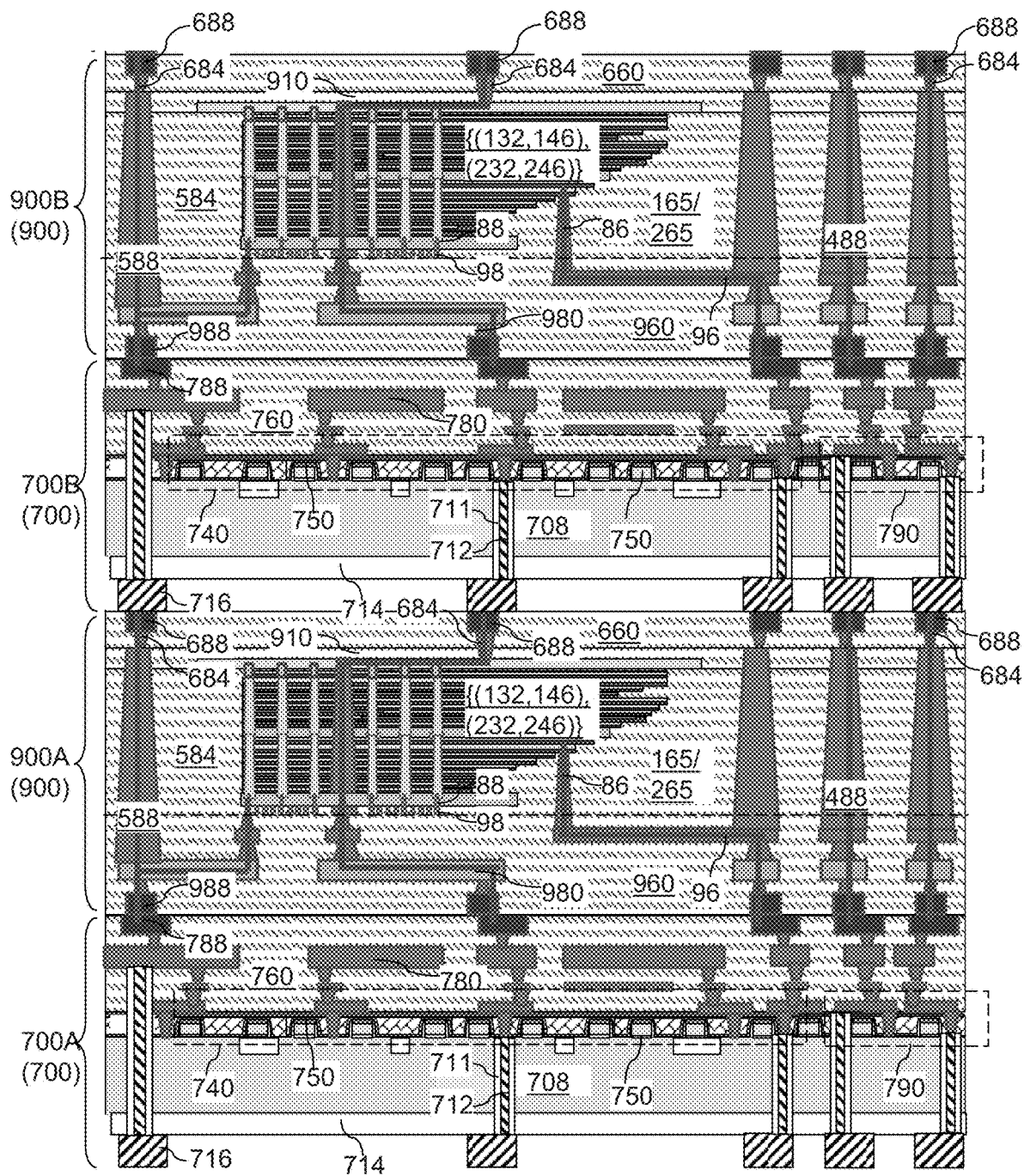
FIG. 24 is a vertical cross-sectional view of the first exemplary bonded assembly after attaching a second support die and a second memory die according to an embodiment of the present disclosure.

Referring to FIG. 24, in an optional embodiment, more than three chips (e.g., more than three die) may be bonded together. A memory-die backside dielectric layer 660 may be optionally deposited on the source-side dielectric material layer 910. Memory-die backside via structures 684 and backside memory-die bonding pads 688 may be formed through the optional memory-die backside dielectric layer 660 and the source-side dielectric material layer 910. A first subset of the backside memory-die bonding pads 688 may be electrically connected to a respective node of the at least one three-dimensional array of memory elements of the first memory die 900A. As second subset of the backside memory-die bonding pads 688 may be electrically isolated from the at least one three-dimensional array of memory elements of the first memory die 900A and may be connected to a respective node of the functional module 790 of the first support die 700A. In one embodiment, the pattern of the backside memory-die bonding pads 688 may be a mirror-image pattern (when viewed toward the interface between the first memory die 900A and the first support die 700A) of the pattern of the backside support-die bonding pads 716 (when viewed toward the interface between the first memory die 900A and the first support die 700A).

A bonded assembly of a second memory die 900B and a second support die 700B may be provided using the same method that is used to provide the bonded assembly of the first memory die 900A and the first support die 700B. The bonded assembly of the second memory die 900B and the second support die 700B may be bonded to the bonded assembly of the first memory die 900A and the first support die 700A. For example, the backside support-die bonding pads 716 of the second support die 700B may be bonded to the backside memory-die bonding pads 688 of the first memory die 900A, or the backside support-die bonding pads 716 of the first support die 700A may be bonded to the backside memory-die bonding pads 688 of the second memory die 900B.

In case a second memory die 900B and a second support die 700B are bonded to the assembly of the first memory die 900A and the first support die 700A. The bonding assembly may comprise a second memory die 900B and a second support die 700B in addition to the first memory die 900A and the first support die 700A. The second memory die 900B may include at least one second three-dimensional array of memory elements, second memory-die metal interconnect structures 980 formed within second memory-die dielectric material layers 960, and second memory-die bonding pads 988 that are located on, or formed within, the second memory-die dielectric material layers 960 and electrically connected to a respective node of the at least one second three-dimensional array of memory elements. The second support die 700B includes at least one second peripheral circuitry 740 including complementary metal-oxide-semiconductor (CMOS) devices and configured to generate control signals for, and receive sense signals from, the at least one second three-dimensional array of memory elements and a second functional module 790 configured to provide a functionality that is independent of operation of the at least one second three-dimensional memory elements. Each of the first functional module 790 in the first support die 700A and the second functional module 790 in the second support die 700B may be independently selected from the various functional modules described above.

In one embodiment, the functional module(s) 790 may also include complementary metal-oxide-semiconductor (CMOS) devices.

In one embodiment, the second support die 700B may include second support-die bonding pads 788 that are located on, or formed within, second support-die dielectric material layers 760, electrically connected to a respective node of the at least one second peripheral circuitry 740, and bonded to the second memory-die bonding pads 988 of the second memory die 900B, and support-die backside bonding pads 716 that are located on an opposite side of the second support-die bonding pads 788 and bonded to backside memory-die bonding pads 688 of the first memory die 900A. In one embodiment, the second functional module 790 of the second support die 700B may be configured to provide a different type of functionality than the first functional module 790 of the first support die 700A.

Figure 25:
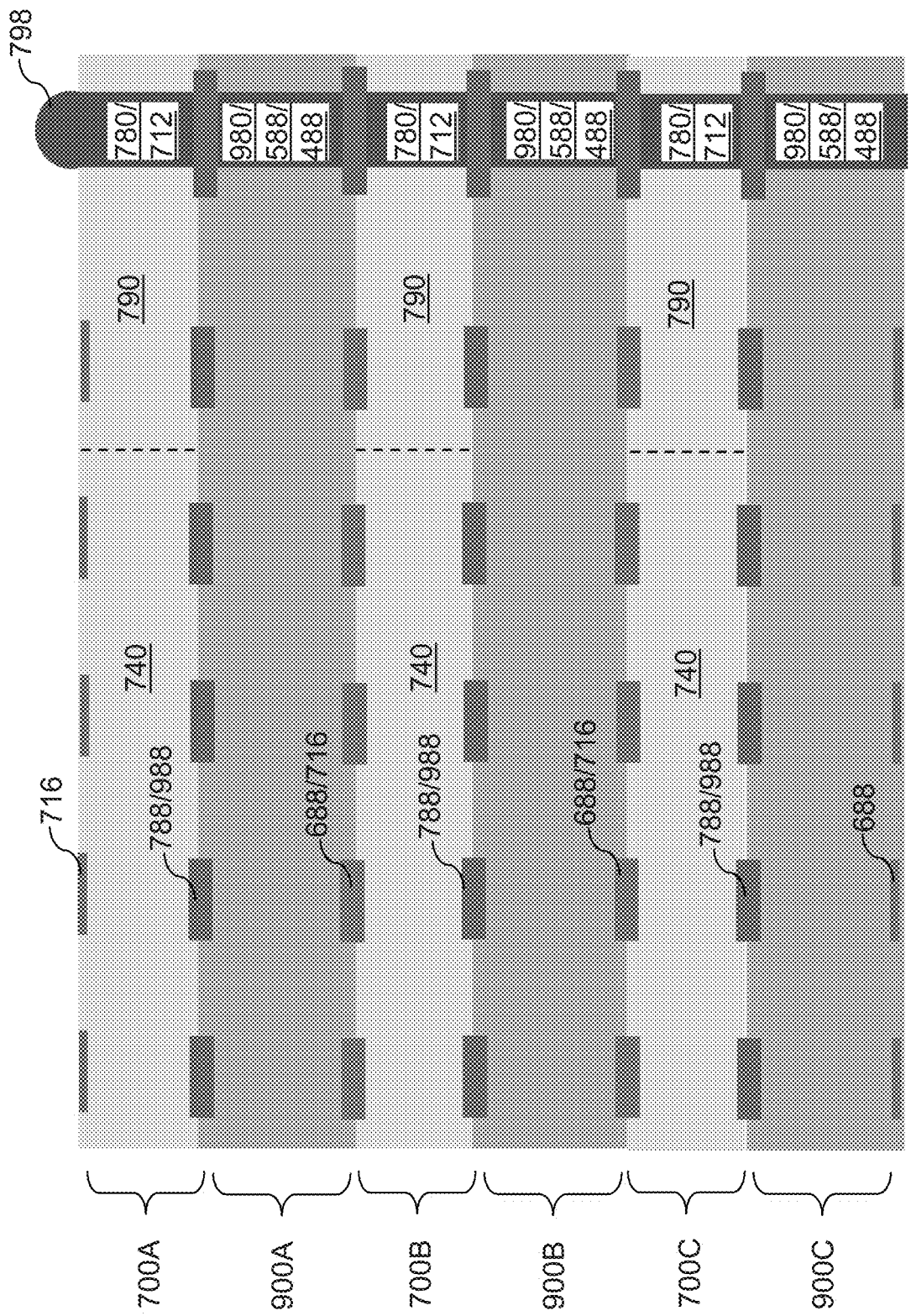
FIG. 25 is a vertical cross-sectional view of the first exemplary bonded assembly after attaching an additional support die, and an additional memory die according to an embodiment of the present disclosure.

Referring to FIG. 25, at least one additional memory die (such as a third memory die 900C) and at least one additional support die (such as a third support die 700C) may be optionally bonded to the bonded assembly including the first memory die 900A, the first support die 700A, the second memory die 900B, and the second support die 700B.

Figure 26:
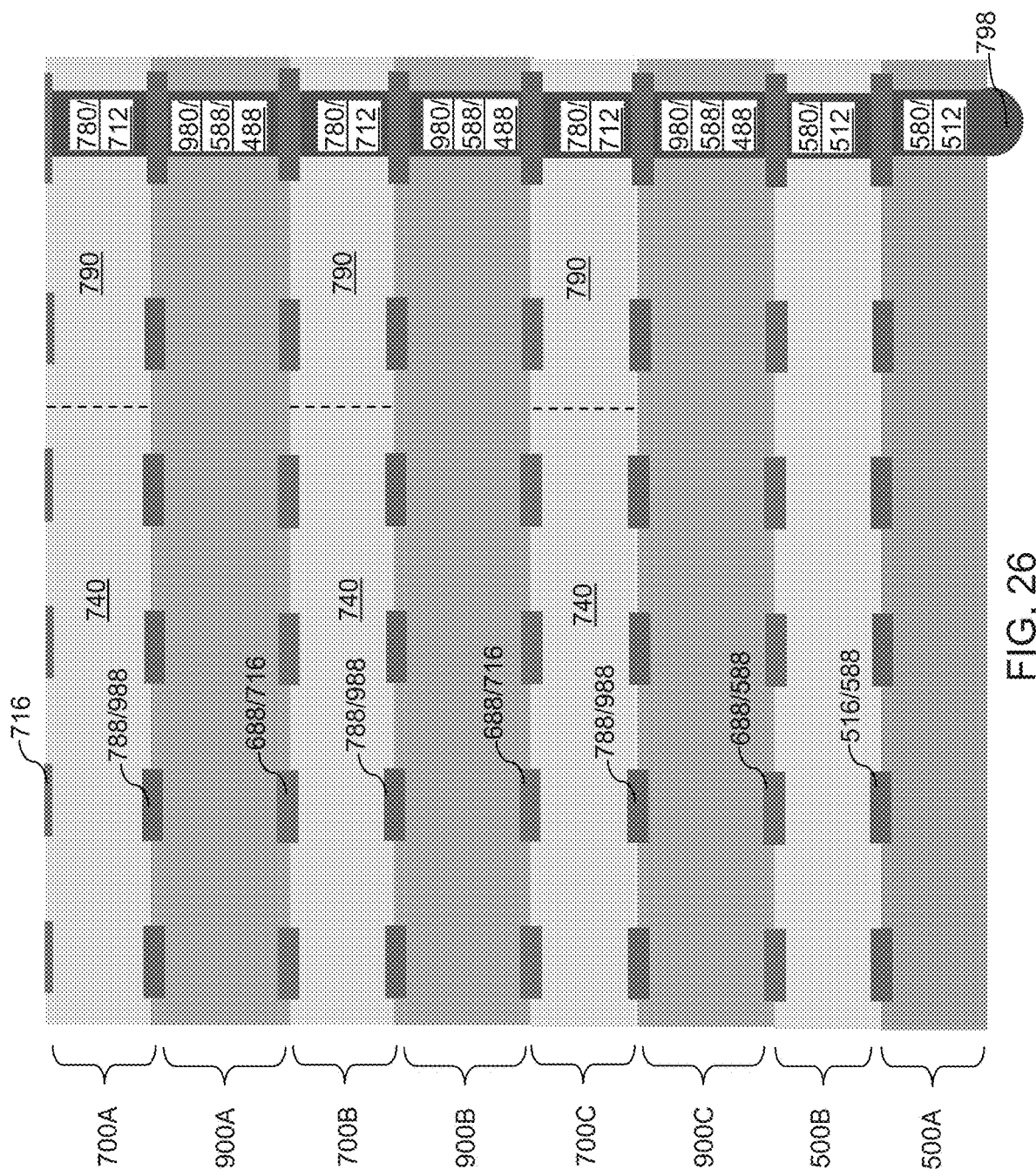
FIG. 26 is a vertical cross-sectional view of the first exemplary bonded assembly including system function dies according to an embodiment of the present disclosure.

Referring to FIG. 26, the first exemplary bonded assembly of FIG. 25 may be further modified by attaching at least one system function die (500A, 500B). The at least one system function die (500A, 500B) may include a single system function die, or a plurality of system function dies. For example, the at least one system function die (500A, 500B) may include a first system function die 500A and a second system function die 500B.

Each system function die (500A, 500B) may be bonded to the first memory die 900A and the first support die 700A directly, or indirectly through a stack of at least one additional memory die (such as the second memory die 900B) and at least one support die (such as the second support die 700B). Each system function die (500A, 500B) may include additional CMOS devices that provides a different functionality than the first functional module 790 or the second functional module 790.

Each system function die (500A, 500B) may include system-function-die bonding pads 588 that bond to memory-die backside bonding pads 688 or support-die backside bonding pads 716, and may include may include backside system-function-die bonding pads 516 that bond to the system-function-die bonding pads 588 of another system function die (500A, 500B) or may be used as external bonding pads. Each system function die (500A, 500B) may include first-side metal interconnect structures 580 that are connected to a respective one of the system-function-die bonding pads 588, and second-side metal interconnect structures 512 that may be connected to a respective one of the backside system-function-die bonding pads 516. A solder ball 798 may be bonded to the backside system-function-die bonding pads 516 or to the second-side metal interconnect structures 512.

Figure 27:
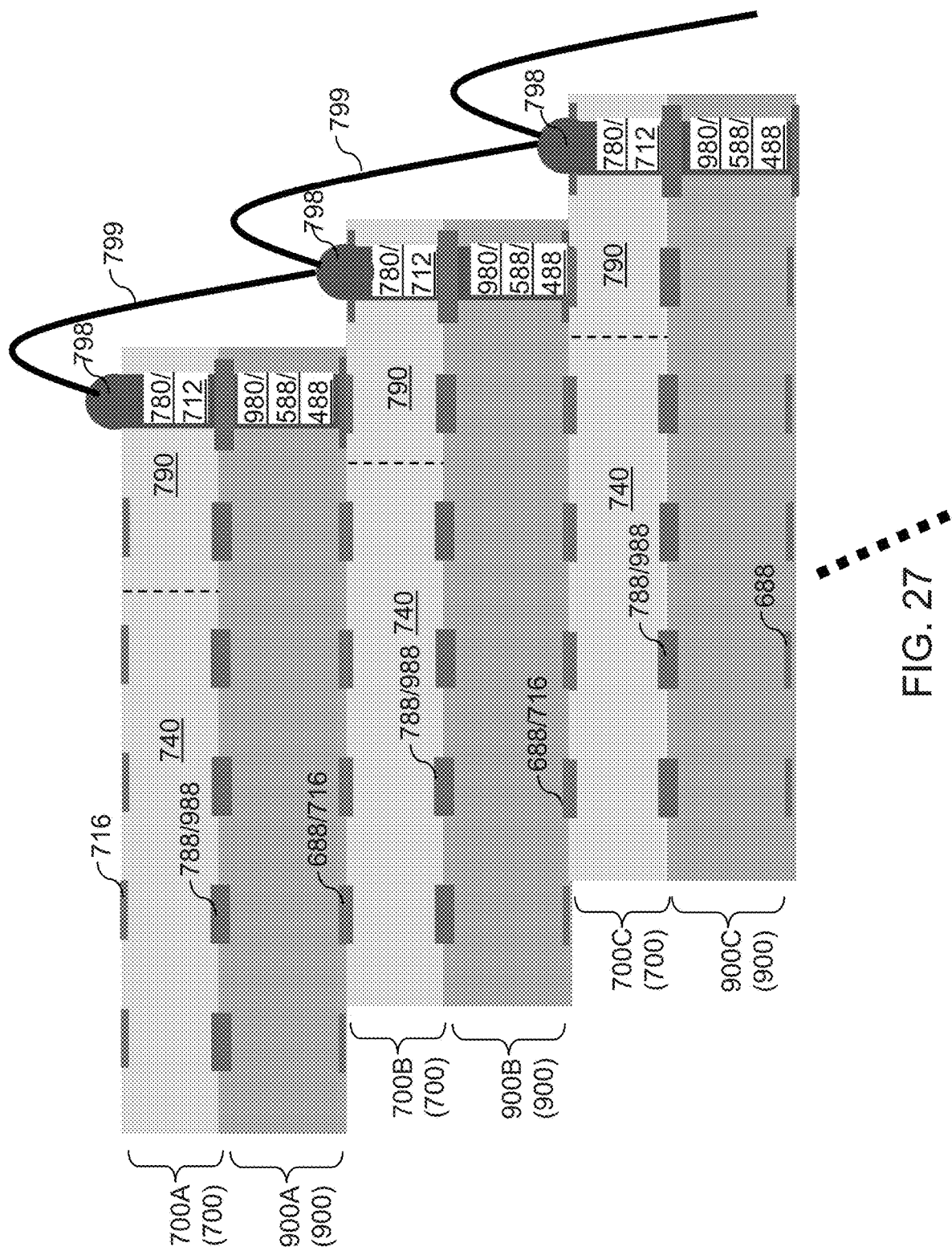
FIG. 27 is a vertical cross-sectional view of a second exemplary bonded assembly according to an embodiment of the present disclosure.

Referring to FIG. 27, a second exemplary bonded assembly according to an embodiment of the present disclosure is illustrated, which may be derived from the first exemplary bonded assembly of FIG. 24, FIG. 25, or FIG. 26 by laterally offsetting edges of each bonded pair of a memory die 900 and a support die 700. If more than two pairs of a memory die 900 and a support die 700 are used, the edges of the bonded pairs of a memory die 900 and a support die 700 may be laterally offset stepwise to physically expose at least one backside support-die bonding pad 716 or at least one backside memory-die bonding pad 688.

In one embodiment, an edge of the second support die 700B may be laterally offset relative to an edge of the first support die 700A, the first support die 700A may include first external bonding pads (which may be a subset of the backside support-die bonding pads 716 of the first support die 700A) located on an opposite side of the first memory-die bonding pads 988, and the second support die 700B may include second external bonding pads which may be a subset of the backside support-die bonding pads 716 of the second support die 700B) located on an opposite side of the second memory-die bonding pads 988 that are not in contact with, and are not covered by, the first memory die 900A or the first support die 700A. A solder ball 798 may be attached to at least one of the physically exposed bonding pads (such as the physically exposed ones selected from the backside support-die bonding pads 716). At least one inter-die connection bonding wire 799 may be used to electrically connect a respective pair of one of the first external bonding pads located on the first support die 700A and one of the second external bonding pads located on the second support die 700B.

The various structures of the embodiments of the present disclosure may be used to utilize the area of each support die 700 that is not used to form a peripheral circuitry 740 for a memory die 900, and to provide additional functionality other than the functionality of a three-dimensional array of memory elements to a bonded assembly including at least one memory die 900 and at least one support die 700. The various embodiments may provide a memory die bonded to a support die containing a functional module with integrated system level functions, which improves the system form factor, improved speed (e.g., due to shorter metal connections between the peripheral and system level components on the same support die) and lower operating power (e.g., due the peripheral and system level components being located on the same support die) since the system does not require signals between the peripheral and system level components to be transferred through the printed circuit board supporting separate system and memory die or chips. In some embodiments, the functional module with the same system level function module may be integrated into each support die. In other embodiments, a functional module with the different system level function module may be integrated into each support die. System level function modules may work as one system level function or multi-system level functions. In other embodiments, a functional module with system level function may be integrated into each support die, and also with system level function die packaged together to improve system performance.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly comprising:
    a first memory die comprising:
        at least one first three-dimensional array of memory elements;
        first memory-die metal interconnect structures formed within first memory-die dielectric material layers; and
        first memory-die bonding pads that are located on, or formed within, the first memory-die dielectric material layers and electrically connected to a respective node of the at least one first three-dimensional array of memory elements; and
    a first support die comprising:
        at least one first peripheral circuitry including complementary metal-oxide-semiconductor (CMOS) devices and configured to generate control signals for, and receive sense signals from, the at least one first three-dimensional array of memory elements;
        a first functional module configured to provide a functionality that is independent of operation of the at least one first three-dimensional array of memory element; and
        first support-die bonding pads that are located on, or formed within, first support-die dielectric material layers, electrically connected to a respective node of the at least one first peripheral circuitry, and bonded to the first memory-die bonding pads.

2. The bonded assembly of claim 1, wherein:
    the first support die comprises first external bonding pads;
    a first subset of the first external bonding pads is electrically connected to a respective node of the at least one first peripheral circuitry; and
    a second subset of the first external bonding pads is electrically connected to a respective node of devices of the first functional module.

3. The bonded assembly of claim 2, wherein the first support die comprises a system level controller module configured to control operation of an additional die that is not present within the bonded assembly.

4. The bonding assembly of claim 2, further comprising:
    first through-substrate via structures extending through a substrate of the first support die and providing electrical connections between the first external bonding pads and nodes of the at least one first peripheral circuitry; and
    second through-substrate via structures extending through the substrate of the first support die and providing electrical connection between the second external bonding pads and the nodes of devices of the first functional module.

5. The bonding assembly of claim 1, further comprising:
    a second memory die comprising:
        at least one second three-dimensional array of memory elements;
        second memory-die metal interconnect structures formed within second memory-die dielectric material layers; and
        second memory-die bonding pads that are located on, or formed within, the second memory-die dielectric material layers and electrically connected to a respective node of the at least one second three-dimensional array of memory elements; and a second support die comprising:
   at least one second peripheral circuitry including complementary metal-oxide-semiconductor (CMOS) devices and configured to generate control signals for, and receive sense signals from, the at least one second three-dimensional array of memory elements;
   a second functional module configured to provide a functionality that is independent of operation of the at least one second three-dimensional memory elements; and
   second support-die bonding pads that are located on, or formed within, second support-die dielectric material layers, electrically connected to a respective node of the at least one second peripheral circuitry, and bonded to the second memory-die bonding pads; and
support-die backside bonding pads that are located on an opposite side of the second support-die bonding pads and bonded to backside memory-die bonding pads of the first memory die.

6. The bonded assembly of claim 5, further comprising a system function die that is bonded to the second memory die directly or indirectly through a stack of at least one additional memory die and at least one support die, wherein the system function die comprises additional CMOS devices that provides a different functionality than the first functional module or the second functional module.

7. The bonded assembly of claim 5, wherein:
an edge of the second support die is laterally offset relative to an edge of the first support die;
the first support die comprises first external bonding pads located on an opposite side of the first memory-die bonding pads; and
the second support die comprises second external bonding pads located on an opposite side of the second memory-die bonding pads that are not in contact with, and are not covered by, the first memory die or the first support die.

8. The bonded assembly of claim 7, further comprising at least one inter-die connection bonding wire that electrically connects a respective pair of one of the first external bonding pads and one of the second external bonding pads.

9. The bonded assembly of claim 5, wherein the second functional module is configured to provide a different type of functionality than the first functional module.

10. The bonded assembly of claim 1, wherein the first functional module comprises an error correction code (ECC) module that is configured to detect and correct data corruption in the at least one first three-dimensional array of memory elements.

11. The bonded assembly of claim 1, wherein the first functional module comprises a memory module configured to interface with an external processor module located outside of the first memory die, wherein the memory module is selected from:
   a dynamic random access memory module;
   a static random access memory module;
   a two-dimensional NAND memory module; or
   a storage class memory (SCM) module.

12. The bonded assembly of claim 1, wherein the first functional module comprises a module selected from:
   a microprocessor unit module that comprises a central processing unit and a memory management unit; and
   a wireless communication module configured to generate or receive wireless signals.

13. The bonded assembly of claim 1, wherein each of the at least one first three-dimensional array of memory elements comprises:
   an alternating stack of insulating layers and electrically conductive layers that are configured as word lines;
   memory stack structures comprising a respective vertical stack of memory elements and a respective vertical semiconductor channel;
   bit lines connected to a first end of a respective subset of the vertical semiconductor channels; and
   a source line connected to a second end of the vertical semiconductor channels.

14. A method of forming a bonded assembly, comprising:
providing a first memory die, wherein the first memory die comprises:
   at least one first three-dimensional array of memory elements;
   first memory-die metal interconnect structures formed within first memory-die dielectric material layers; and
   first memory-die bonding pads that are located on, or formed within, the first memory-die dielectric material layers and electrically connected to a respective node of the at least one first three-dimensional array of memory elements;
providing a first support die, wherein the first support die comprises:
   at least one first peripheral circuitry including complementary metal-oxide-semiconductor (CMOS) devices and configured to generate control signals for, and receive sense signals from, the at least one first three-dimensional array of memory elements;
   a first functional module configured to provide a functionality that is independent of operation of the at least one first three-dimensional array of memory elements;
   first support-die bonding pads that are located on, or formed within, first support-die dielectric material layers, electrically connected to a respective node of the at least one first peripheral circuitry; and
bonding the first support-die bonding pads to the first memory-die bonding pads.

15. The method of claim 14, wherein:
the first support die comprises first external bonding pads;
a first subset of the first external bonding pads is electrically connected to a respective node of the at least one first peripheral circuitry;
second subset of the first external bonding pads is electrically connected to a respective node of devices of the first functional module; and
the method further comprises attaching bonding wires to at least one of the first external bonding pads.

16. The method of claim 15, wherein the first support die comprises a system level controller module configured to control operation of an additional die that is not present within the bonded assembly.

17. The method of claim 15, further comprising:
forming first through-substrate via structures extending through a substrate of the first support die, wherein the first through-substrate via structures provide electrical connections between the first external bonding pads and nodes of the at least one first peripheral circuitry; and
forming second through-substrate via structures extending through the substrate of the first support diem wherein the second through-substrate via structures provide electrical connection between the second external bonding pads and the nodes of devices of the first functional module.

18. The method of claim 14, further comprising:
attaching a second support die to the first memory die; and
attaching a second memory die to the second support die, wherein:
the second memory die comprises:
- at least one second three-dimensional array of memory elements;
- second memory-die metal interconnect structures formed within second memory-die dielectric material layers; and
- second memory-die bonding pads that are located on, or formed within, the second memory-die dielectric material layers and electrically connected to a respective node of the at least one second three-dimensional array of memory elements;

the second support die comprises:
- at least one second peripheral circuitry including complementary metal-oxide-semiconductor (CMOS) devices and configured to generate control signals for, and receive sense signals from, the at least one second three-dimensional array of memory elements;
- a second functional module configured to provide a functionality that is independent of operation of the at least one second three-dimensional memory elements; and
- second support-die bonding pads that are located on, or formed within, second support-die dielectric material layers, electrically connected to a respective node of the at least one second peripheral circuitry, and bonded to the second memory-die bonding pads; and
- support-die backside bonding pads that are located on an opposite side of the second support-die bonding pads and bonded to backside memory-die bonding pads of the first memory die.

19. The method of claim 18, further comprising attaching a system function die to the second memory die directly or indirectly through a stack of at least one additional memory die and at least one support die, wherein the system function die comprises additional CMOS devices that provides a different functionality than the first functional module or the second functional module.

20. The method of claim 14, wherein each of the at least one first three-dimensional array of memory elements comprises:
- an alternating stack of insulating layers and electrically conductive layers that are configured as word lines;
- memory stack structures comprising a respective vertical stack of memory elements and a respective vertical semiconductor channel;
- bit lines connected to a first end of a respective subset of the vertical semiconductor channels; and
- a source line connected to a second end of the vertical semiconductor channels.

* * * * *